(12) United States Patent
Kodera et al.

(10) Patent No.: US 10,769,011 B2
(45) Date of Patent: Sep. 8, 2020

(54) MEMORY DEVICE THAT CHANGES A WRITABLE REGION OF A DATA BUFFER BASED ON AN OPERATIONAL STATE OF AN ECC CIRCUIT

(71) Applicant: TOSHIBA MEMORY CORPORATION, Tokyo (JP)

(72) Inventors: Shunsuke Kodera, Yokohama Kanagawa (JP); Toshihiko Kitazume, Kawasaki Kanagawa (JP); Kenichirou Kada, Yokohama Kanagawa (JP); Nobuhiro Tsuji, Yokohama Kanagawa (JP); Shinya Takeda, Yokohama Kanagawa (JP); Tetsuya Iwata, Yokohama Kanagawa (JP); Yoshio Furuyama, Yokosuka Kanagawa (JP); Hirosuke Narai, Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/061,983

(22) Filed: Mar. 4, 2016

(65) Prior Publication Data
US 2017/0060682 A1 Mar. 2, 2017

(30) Foreign Application Priority Data
Aug. 28, 2015 (JP) .................. 2015-169413

(51) Int. Cl.
*G06F 11/00* (2006.01)
*G06F 11/10* (2006.01)
*G11C 29/04* (2006.01)

(52) U.S. Cl.
CPC ...... *G06F 11/1044* (2013.01); *G06F 11/1052* (2013.01); *G06F 11/1068* (2013.01); *G11C 2029/0411* (2013.01)

(58) Field of Classification Search
None
See application file for complete search history.

(56) References Cited

U.S. PATENT DOCUMENTS

| 6,216,248 B1 | 4/2001 | McConnell et al. |
| 8,078,941 B2 | 12/2011 | Aizawa |

(Continued)

FOREIGN PATENT DOCUMENTS

| JP | 2006155408 A | 6/2006 |
| JP | 2008535131 A | 8/2008 |

(Continued)

OTHER PUBLICATIONS

Toshiba MOS Digital Integrated Circuit Silicon Gate CMOS, TC58NVG0S3HTA00, Aug. 31, 2012, 51 pages.

(Continued)

*Primary Examiner* — Mujtaba M Chaudry
(74) *Attorney, Agent, or Firm* — Kim & Stewart LLP

(57) ABSTRACT

A memory device includes a semiconductor memory unit, a controller circuit configured to communicate with a host through a serial interface, store write data to be written into a page of the semiconductor memory unit in a data buffer, and an error-correcting code (ECC) circuit configured to generate an error correction code from the write data if the ECC circuit is enabled. The controller circuit writes the error correction code with the write data into the page if the ECC circuit is enabled. A maximum column address of the page which is accessible from the host changes depending on whether or not the ECC circuit is enabled.

20 Claims, 24 Drawing Sheets

(56) References Cited

U.S. PATENT DOCUMENTS

| | | | |
|---|---|---|---|
| 8,102,710 B2 | 1/2012 | Pekny et al. | |
| 8,555,144 B2 | 10/2013 | Aizawa | |
| 9,042,199 B2 | 5/2015 | Gillingham et al. | |
| 9,128,822 B2 | 9/2015 | Michael et al. | |
| 9,159,374 B2 | 10/2015 | Kim et al. | |
| 9,437,312 B2 | 9/2016 | Bryant-Rich et al. | |
| 2001/0028523 A1* | 10/2001 | Moro | G11C 29/70 360/53 |
| 2004/0153902 A1 | 8/2004 | Machado et al. | |
| 2006/0200723 A1* | 9/2006 | Carnevale | G06F 11/1044 714/758 |
| 2006/0218467 A1 | 9/2006 | Sibigtroth et al. | |
| 2007/0192664 A1 | 8/2007 | Ogawa et al. | |
| 2008/0022186 A1* | 1/2008 | Co | G06F 11/1044 714/763 |
| 2008/0294938 A1* | 11/2008 | Kondo | G06F 11/1068 714/24 |
| 2009/0137070 A1* | 5/2009 | Co | G11C 29/06 438/17 |
| 2009/0158124 A1* | 6/2009 | Kawai | G06F 3/0614 714/763 |
| 2013/0297987 A1 | 11/2013 | Gupta et al. | |
| 2014/0089755 A1 | 3/2014 | Kantamsetti et al. | |
| 2014/0157043 A1* | 6/2014 | Ruggiero | G06F 11/1048 714/6.2 |
| 2014/0189212 A1 | 7/2014 | Slaight et al. | |
| 2014/0258811 A1* | 9/2014 | Liu | G06F 11/1044 714/766 |
| 2014/0331101 A1 | 11/2014 | Chung et al. | |
| 2015/0058697 A1* | 2/2015 | Iwasaki | G06F 11/1048 714/773 |
| 2015/0128011 A1 | 5/2015 | Rochman et al. | |
| 2015/0331745 A1 | 11/2015 | Zastrow | |
| 2015/0347227 A1* | 12/2015 | Rabenalt | G06F 3/0679 714/764 |
| 2016/0004596 A1 | 1/2016 | Dabreu | |
| 2016/0062825 A1 | 3/2016 | Shiratake | |
| 2016/0147594 A1 | 5/2016 | Walker et al. | |
| 2017/0308433 A1 | 10/2017 | Kwon et al. | |

FOREIGN PATENT DOCUMENTS

| | | |
|---|---|---|
| JP | 2014038593 A | 2/2014 |
| JP | 2014059949 A | 4/2014 |
| JP | 2015501490 A | 1/2015 |
| TW | 200935234 A | 8/2009 |
| WO | 2006104584 A2 | 10/2006 |
| WO | 2009051953 A1 | 4/2009 |

OTHER PUBLICATIONS

Toshiba MOS Digital Integrated Circuit Silicon Gate CMOS, TC58BVG0S3HTA00, Aug. 31, 2012, 44 pages.

NAND Flash Memory, Serial Peripheral Interface (SPI), MT29F1G01AAADD, 43 pages.

Taiwan Office Action dated Apr. 14, 2017, filed in Taiwan counterpart Application No. 105103362, 11 pages (with translation).

Japanese Office Action dated May 29, 2018, filed in Japanese counterpart Application No. 2015-169413, 11 pages (with translation).

GigaDevice, SPI (Serial Peripheral Interface) NAND Flash Memory, GD5F4GQ4UAYIG, Apr. 23, 2013, 32 pages.

Zentel Electronics Corp., 1Gb SLC SPI-NAND Flash Specification, A5U1GA21ASC, Revision 1.0, Jun. 2014, 37 pages.

Taiwan Office Action dated Jan. 13, 2017, filed in Taiwan counterpart Application No. 105103362, 9 pages (with translation).

Taiwan Office Action dated Sep. 20, 2017, filed in Taiwan counterpart Application No. 105103362, 11 pages (with translation).

* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

FIG. 4

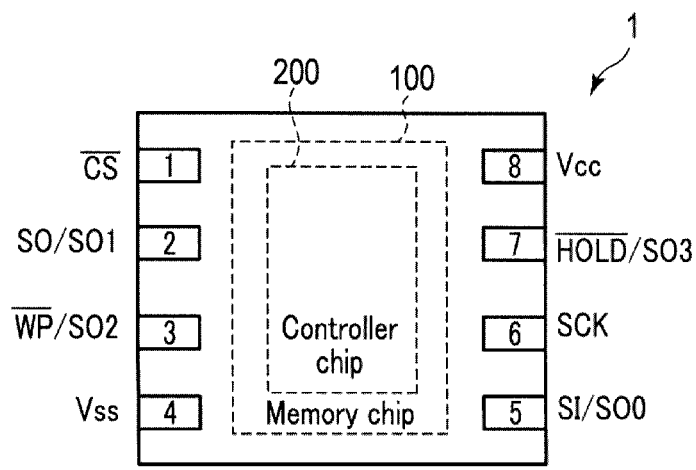

FIG. 5

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

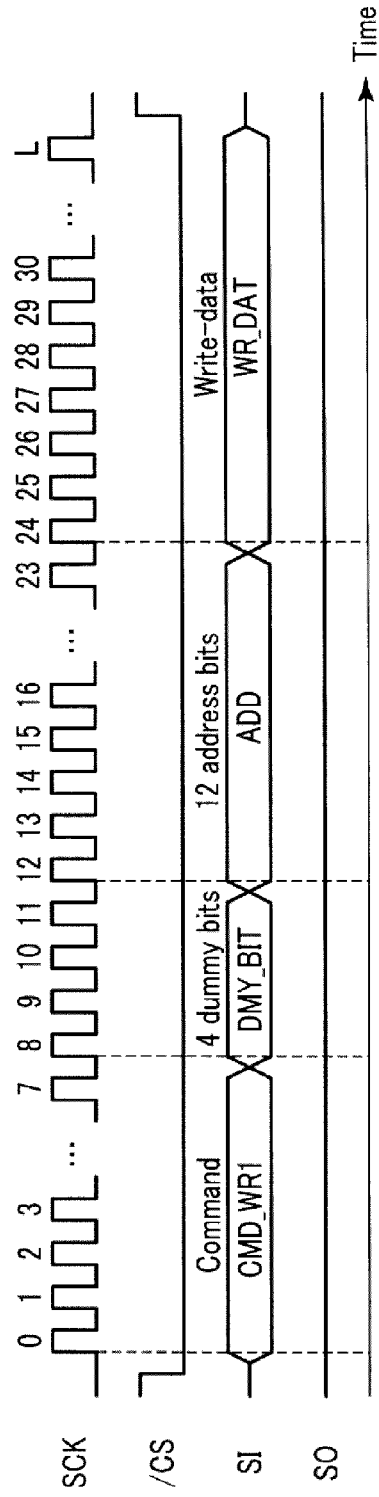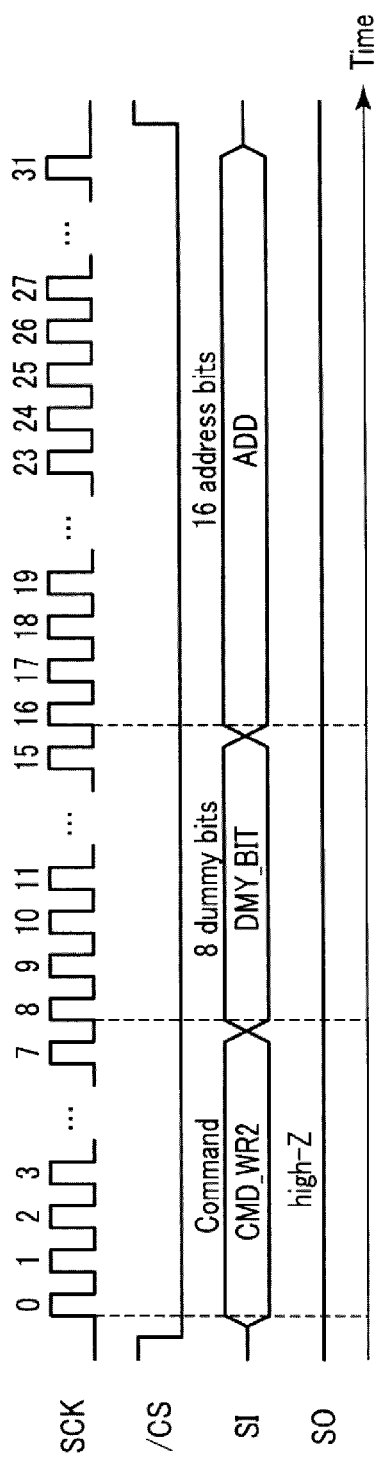

FIG. 19

```
/CE   "L"
ALE   _⎾⎿⎾⎿⎾⎿_____
CLE   ⎾⎿_____⎾⎿_____⎾⎿_____
/WE   _⎾⎿⎾⎿⎾⎿⎾⎿⎾⎿_____⎾⎿_____
/RE   _____⎿⎾___
IO    —⟨60h⟩⟨ADD⟩⟨ADD⟩⟨ADD⟩⟨D0h⟩———⟨70h⟩⟨ST_DAT⟩—
/RB   _____⎿___⎾_____
                                    → Time
```

FIG. 20

| Address | Bit | | | | | | | |
|---|---|---|---|---|---|---|---|---|
| | 7 | 6 | 5 | 4 | 3 | 2 | 1 | 0 |
| B0h | PRT_E (R/W) | IDR_E (R/W) | Reserved | ECC_E (R/W) | Reserved | BBI (R) | HSE (R/W) | Reserved |
| C0h | Reserved | Reserved | ECC1 (R) | ECC0 (R) | PRG_F (R) | ERS_F (R) | WEL (R/W) | OIP (R) |

FIG. 21

| ECCS1 | ECCS0 | Description |
|---|---|---|
| 0 | 0 | No bit errors were detected in previous page read |
| 0 | 1 | Bit errors were detected and corrected<br>Bit error count did not exceed the bit flip detection threshold |
| 1 | 0 | Multiple errors were detected and not corrected |
| 1 | 1 | Bit errors were detected and corrected<br>Bit error count exceeded the bit flip detection threshold |

MEMORY DEVICE THAT CHANGES A WRITABLE REGION OF A DATA BUFFER BASED ON AN OPERATIONAL STATE OF AN ECC CIRCUIT

CROSS-REFERENCE TO RELATED APPLICATION

This application is based upon and claims the benefit of priority from Japanese Patent Application No. 2015-169413, filed Aug. 28, 2015, the entire contents of which are incorporated herein by reference.

FIELD

An embodiment described herein relates generally to a memory device, in particular, a memory device that changes a writable region of a data buffer based on an operational state of an error-correcting code (ECC) circuit.

BACKGROUND

NAND-type flash memory is widely known as a memory device.

DESCRIPTION OF THE DRAWINGS

FIG. 3 illustrates functions of external terminals of the memory system according to the embodiment.

FIG. 4 is an exterior plan view of another memory system according to the embodiment.

FIG. 5 illustrates functions of external terminals of the memory system shown in FIG. 4.

FIGS. 15-17 are timing charts of various signals during writing of data in the memory system according to the embodiment.

FIGS. 18-19 are timing charts of various signals during erasing of data in the memory system according to the embodiment.

FIG. 20 is a schematic diagram of a feature table according to the embodiment.

FIG. 21 illustrates content of information held in the feature table according to the embodiment.

DETAILED DESCRIPTION

Figure 1:
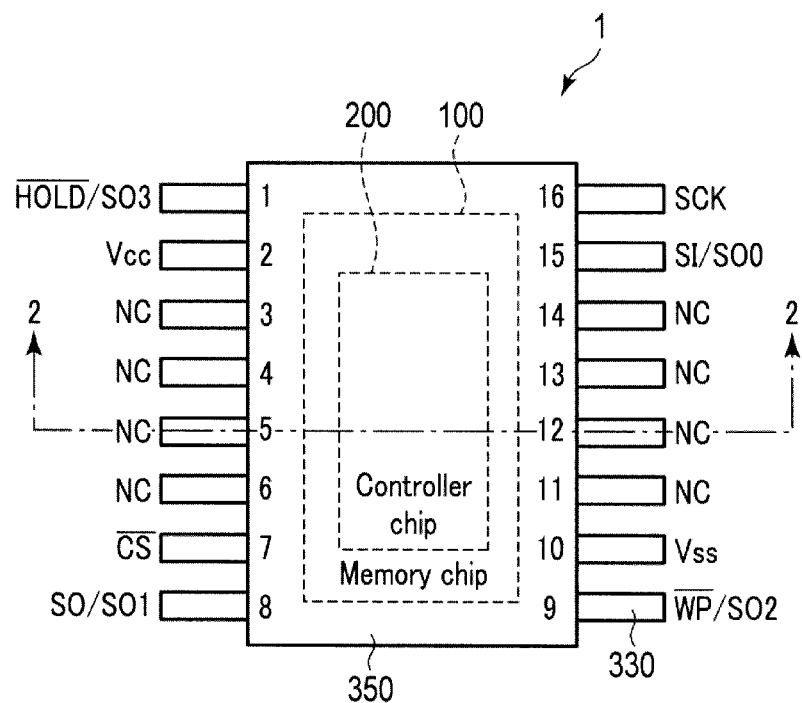
FIG. 1 is an exterior plan view of a memory system according to an embodiment.

One or more embodiments provide a memory system capable of appropriately setting an area which is writable from a host apparatus.

In general, according to an embodiment, a memory device includes a semiconductor memory unit, a controller circuit configured to communicate with a host through a serial interface, store write data to be written into a page of the semiconductor memory unit in a data buffer, and an error-correcting code (ECC) circuit configured to generate an error correction code from the write data if the ECC circuit is enabled. The controller circuit writes the error correction code with the write data into the page if the ECC circuit is enabled. A maximum column address of the page which is accessible from the host changes depending on whether or not the ECC circuit is enabled.

Hereinafter, an embodiment will be described with reference to the drawings. In the following description, configuring elements having the same function and configuration are described with common reference numerals.

1. Embodiment

A memory system according to an embodiment will be described.

1.1 Configuration 1.1.1 Entire Configuration of Memory System

First, an entire configuration of the memory system according to the present embodiment will be described with reference to FIGS. 1 and 2. FIG. 1 is an exterior plan view of the memory system according to the present embodiment, and FIG. 2 is a cross-sectional view thereof taken along the line II-II in FIG. 1.

As illustrated, a memory system 1 includes two semiconductor chips (modules) 100 and 200. The semiconductor chip (memory chip) 100 includes a semiconductor memory such as a NAND-type flash memory, and the semiconductor chip 200 (controller chip) includes a controller which controls the memory chip 100. The semiconductor chips 100 and 200 are mounted on a lead frame 300, and are packaged by being sealed with a resin 350.

Figure 2:
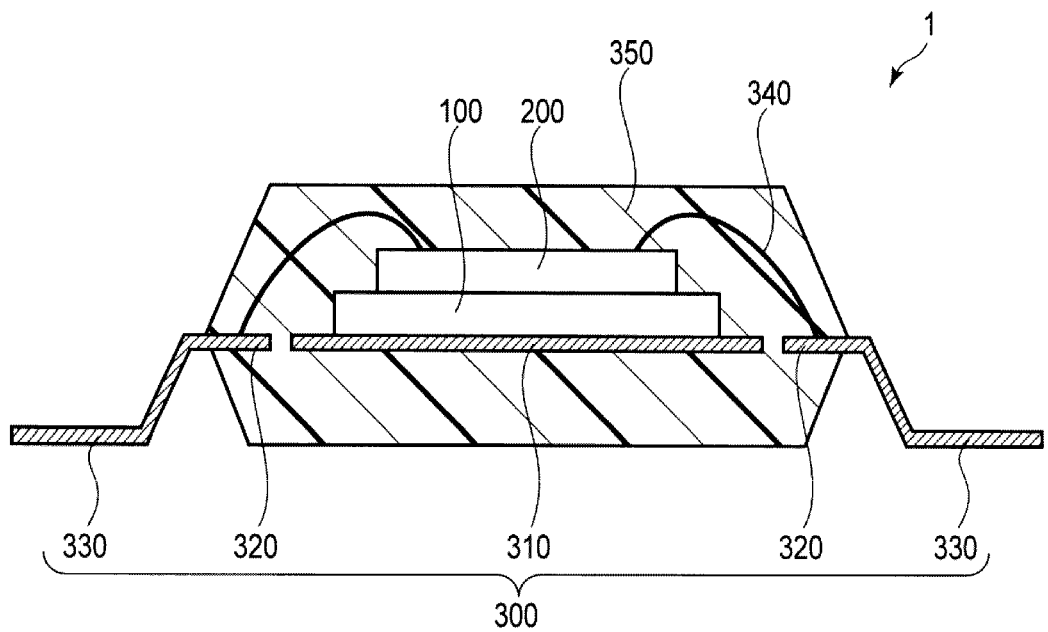
FIG. 2 is a cross-sectional view of the memory system according to the embodiment.

More specifically, as illustrated in FIG. 2, the memory chip 100 is mounted on a die pad 310 of the lead frame 300, and the controller chip 200 is superposed on the memory chip 100.

The controller chip 200 is connected to an inner lead 320 of the lead frame via, for example, a bonding wire 340, and is also connected to the memory chip 100 via a bonding wire (not illustrated). The memory chip 100, the controller chip 200, the die pad 310, the inner lead 320, and the bonding wire 340 are sealed with, for example, the resin 350.

The inner lead 320 is connected to an outer lead 330 which is exposed to the outside of the resin 350. The outer lead 330 functions as an external connection terminal (external connection pin) of the memory system 1. In FIG. 1, sixteen external connection terminals including a first pin to a sixteenth pin are provided. The memory system 1 performs communication with a host apparatus which controls the memory system 1 (more specifically, accesses the memory chip 100) via the pins.

FIG. 3 illustrates functions of the respective pins. As illustrated, the first pin is used to receive a control signal /HOLD, or to output serial data SO3. The control signal /HOLD is asserted (has an "L" level) when communication between the host apparatus and the memory system 1 is temporarily stopped. The second pin receives a power supply voltage Vcc. The third to sixth pins and the eleventh to fourteenth pins are reserved pins, and may be used, for example, when a certain signal or data are required to be transmitted and received in the future. The seventh pin receives a chip select signal/CS. The chip select signal/CS is a signal for activating the memory chip 100 and the controller chip 200 (in other words, a signal is asserted when accessing the memory system 1), and is asserted (has an "L" level), for example, at a timing at which the host apparatus inputs a command to the memory system 1. The eighth pin is used to output serial data (SO or SO1). The ninth pin is used to receive a control signal /WP or to output serial data (SO2). The control signal /WP is a write protect signal, and is asserted (has an "L" level) when writing data to the memory chip is inhibited. The tenth pin receives a reference potential Vss. The fifteenth pin is used to receive serial data (SI) or to output serial data (S0). The sixteenth pin receives a serial clock signal SCK.

The pin configuration conforms to the serial peripheral interface (SPI). The first pin, the eighth pin, the ninth pin, and the fifteenth pin are arbitrarily selected for use in outputting serial data, and can output data to the host apparatus at 1-time speed, 2-time speed or 4-time speed.

FIG. 4 illustrates an example of a package configuration which is different from the one illustrated in FIG. 1. In FIG. 4, eight external connection terminals including a first pin to an eighth pin are provided. FIG. 5 illustrates functions of the respective pins shown in FIG. 4.

As illustrated, the first pin receives the chip select signal/CS. The second pin outputs the serial data SO and SO1. The third pin receives the write protect signal /WP or outputs the serial data SO2. The fourth pin receives the reference potential Vss. The fifth pin receives the serial data SI or outputs the serial data SO0. The sixth pin receives the serial clock signal SCK. The seventh pin receives the control signal /HOLD or outputs the serial data SO3. The eighth pin receives the power supply voltage Vcc.

Also in this case, the pin configuration conforms to the SPI.

Figure 6:
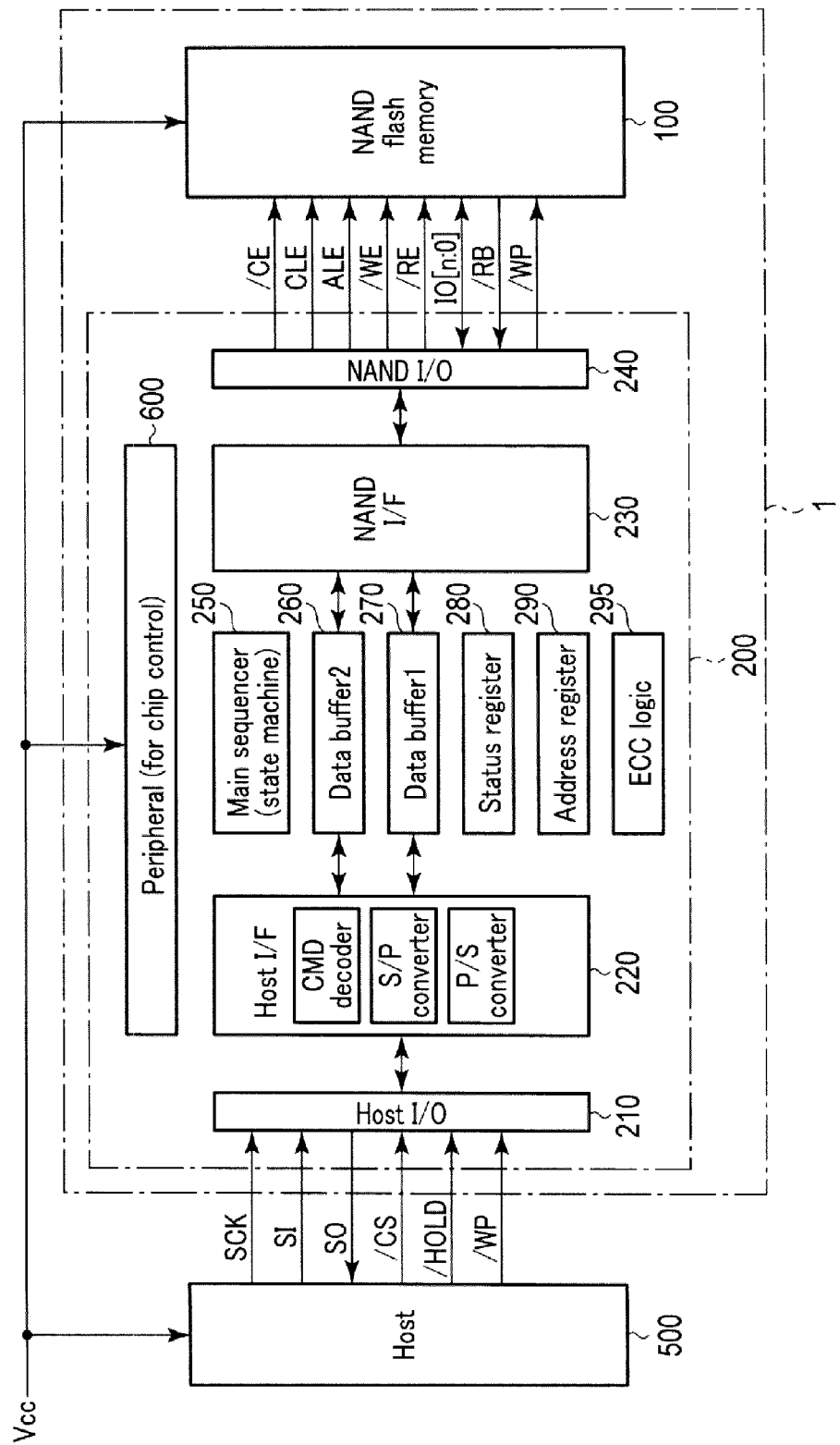
FIG. 6 is a block diagram of the memory system according to the embodiment.

FIG. 6 is a functional block diagram illustrating an internal configuration of the memory system 1. Hereinafter, the memory chip 100 is referred to as a NAND-type flash memory 100, and the controller chip 200 is simply referred to as a controller 200.

As illustrated, the memory system 1 includes the NAND-type flash memory 100 and the controller 200.

The NAND-type flash memory 100 includes a plurality of memory cells and stores data in a nonvolatile manner. The controller 200 is connected to the NAND-type flash memory 100 via NAND buses, and connected to a host apparatus 500 via SPI buses. The controller 200 controls access to the NAND-type flash memory 100.

Each of the NAND buses performs transmission and reception of signals based on a NAND interface protocol. Specific examples of the signals include a chip enable signal /CE, an address latch enable signal ALE, a command latch enable signal CLE, a write enable signal /WE, a read enable signal /RE, a ready busy signal /RB, an input or output signal I/O, and a write protect signal /WP.

The signal /CE is asserted in a low level so as to activate the NAND-type flash memory 100, when accessing the NAND-type flash memory 100. The signals CLE and ALE are used to notify the NAND-type flash memory 100 that input signals I/O to the NAND-type flash memory 100 are respectively a command and an address. The signal /WE is asserted in a low level so that the input signal I/O is input to the NAND-type flash memory 100. The signal /RE is also asserted in a low level so that the output signal I/O is read from the NAND-type flash memory 100. The ready busy signal /RB indicates whether the NAND-type flash memory 100 is in a ready state (a state of being capable of receiving a command from the controller 200) or in a busy state (a state of being incapable of receiving a command from the controller 200), and a low level thereof indicates the busy state. The input or output signal I/O is, for example, an 8-bit (n=8) signal. The input or output signal I/O is the entity of data which are transmitted and received between the NAND-type flash memory 100 and the controller 200, and includes a command, an address, data to be written (referred to as write data in some cases), and read data. The signal /WP is a signal for inhibiting data from being written to the NAND-type flash memory 100.

The SPI buses are substantially similar to the ones described with reference to FIGS. 3 and 5.

1.1.2 Configuration of Controller 200

Next, with reference to FIG. 6, details of a configuration of the controller 200 will be described. As illustrated, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, an ECC circuit 295, and a peripheral circuit 600.

The host input/output circuit 210 functions as a buffer of signals which are transmitted to and received from the host apparatus 500. The signals SCK, SI, /CS, /HOLD and /WP are first received by the host input/output circuit 210 and are then output to the host interface circuit 220.

The host interface circuit 220 receives the signal SI in synchronization with the signal SCK. The host interface circuit 220 transmits the signal SO which is recovered in synchronization with the signal SCK, to the host apparatus 500 via the host input/output circuit 210.

The host interface circuit 220 controls transmission and reception of signals with the host apparatus 500 via the host input/output circuit 210. The host interface circuit 220 functions as a serial/parallel converter and a parallel/serial converter. For example, the input signal SI from the host apparatus 500 is converted from a serial signal into a parallel signal, and data read from the NAND-type flash memory 100 is converted from a parallel signal into a serial signal. If the input signal SI is a command, the host interface circuit 220 functions as a command decoder and decodes the received command. A decoded result is output to, for example, the sequencer 250.

The data buffers 260 and 270 temporarily holds write data received from the host apparatus 500, via the host interface circuit 220. Data read from the NAND-type flash memory 100 are received via the NAND interface circuit 230 and temporarily held.

The status register 280 holds various kinds of status information of the memory system 1. For example, a feature table (described below) is held.

The address register 290 holds an address received from the host apparatus 500, via the host interface circuit 220.

The NAND interface circuit 230 controls transmission and reception of signals to and from the NAND-type flash memory 100 via the NAND input/output circuit 240. The NAND interface circuit 230 issues various commands conforming to the NAND interface protocol in response to a command from the sequencer 250, and outputs the commands to the NAND-type flash memory 100 along with an address in the address register 290 via the NAND input/output circuit 240. During writing of data, the data in at least one of the data buffer 260 and 270 is output to the NAND-type flash memory 100 via the NAND input/output circuit 240. During reading of data, data read from the NAND-type flash memory 100 is transmitted to at least one of the data buffer 260 and 270.

The NAND input/output circuit 240 functions as a buffer of signals which are transmitted to or received from the NAND-type flash memory 100. The NAND input/output circuit 240 asserts or deasserts the signals /CE, CLE, ALE, /WE, /RE and /WP in response to commands from the NAND interface circuit 230. During reading of data, the NAND input/output circuit 240 temporarily holds a signal IO (read data) and transmits the signal to the NAND interface circuit 230. During writing of data, the NAND input/output circuit 240 temporarily holds a signal IO (data to be written) and transmits the signal to the NAND-type flash memory 100. The ready busy signal /RB is received from the NAND-type flash memory 100 and is transmitted to the NAND interface circuit 230.

The sequencer 250 controls the entire operation of the controller 200. For example, if a data reading request is received from the host apparatus 500, the sequencer 250 instructs the NAND interface circuit 230 to execute an operation for performing a reading operation. If a data writing request is received from the host apparatus 500, the sequencer 250 instructs the NAND interface circuit 230 to execute an operation for performing a reading operation. The feature table in the status register 280 is updated based on status information received from the NAND-type flash memory 100 or setting information for updating settings of the feature table, received from the host apparatus 500.

The ECC circuit 295 performs error detection and error correction processes. More specifically, during writing of data, ECC parity is generated for each set (hereinafter, referred to as "data pair") of a sector and a spare area provided in the sector, based on data received from the host apparatus 500. The ECC circuit 295 transmits pair of the ECC parity and the data to the data register 140 of the NAND-type flash memory 100. During reading of data, the ECC circuit 295 decodes each pair of data and detects the presence or absence of an error based on ECC parity included in the data, which are transmitted from the data register 140 to the controller 200. If an error is detected, a bit position thereof is specified, and the error is corrected. The number of error bits which can be corrected for each data pair is, for example, 8 bits per data pair in this example. The ECC circuit 295 may output the number of error bits detected in each pair of data to the status register 280 as status information. Details of the sector and the spare area will be described below.

The peripheral circuit 600 receives the power supply voltage Vcc from an external device, transmits the voltage to each circuit block, and performs other control which is necessary in an operation of the controller 200.

1.1.3 Configuration of NAND-type Flash Memory 100

Figure 7:
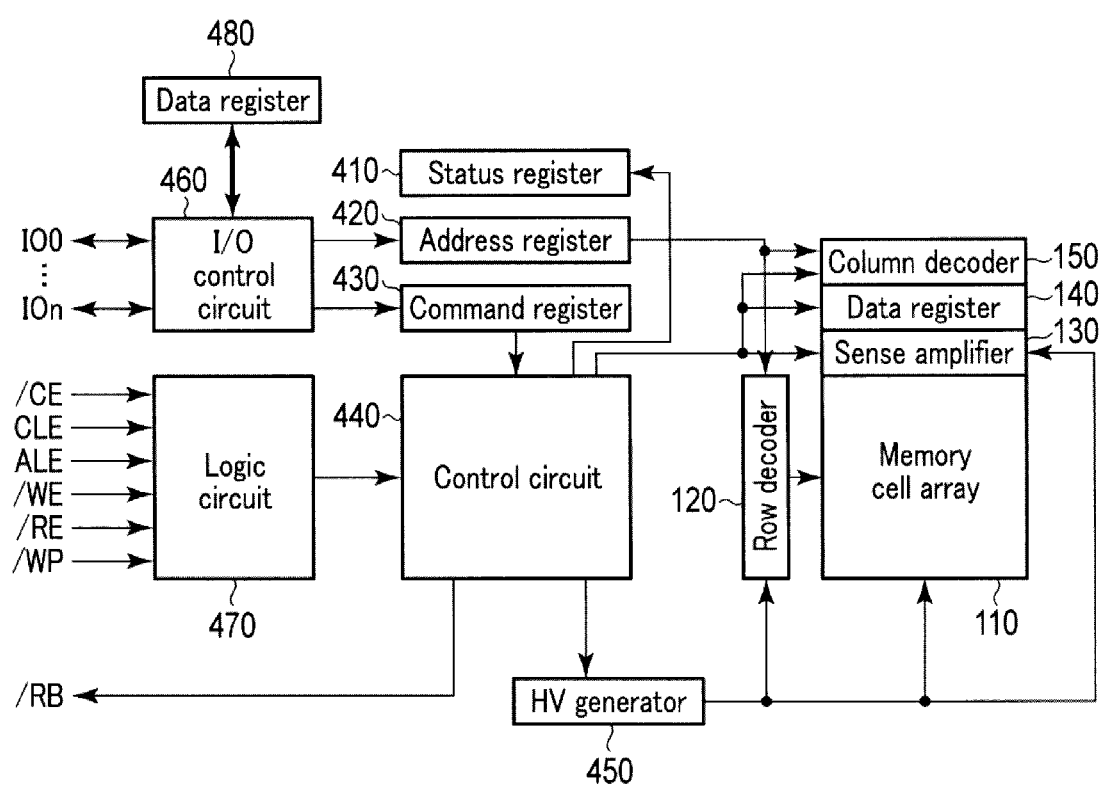
FIG. 7 is a block diagram of a semiconductor memory device according to the embodiment.

Next, with reference to FIG. 7, a configuration of the NAND-type flash memory 100 will be described. FIG. 7 is a block diagram of the NAND-type flash memory 100.

As illustrated, the NAND-type flash memory 100 includes a memory cell array 110, a row decoder 120, a sense amplifier 130, a data register 140, a column decoder 150, a status register 410, an address register 420, a command register 430, a control circuit 440, a voltage generation circuit 450, an input/output control circuit 460, a logic circuit 470, and a data register 480.

The memory cell array 110 includes a plurality of non-volatile memory cells arranged in rows and columns. Memory cells in the same row are connected to the same word line, and memory cells in the same column are connected to the same bit line. Reading and writing of data are collectively performed on a plurality of memory cells connected to the same word line. This unit of reading and writing of data is referred to as a page. Erasing of data is collectively performed in the units of a plurality of pages. The unit is referred to as a block. A data area corresponding to one page includes a main storing area in which net data are stored and a management area in which management data such as ECC parity is stored. The net data are managed in the unit called a sector. For example, in the present embodiment, the main storing area in one page includes four sectors, and each sector has a data size of 512 bytes. The management data include, for example, ECC parity data for correcting errors, and, for example, update number information which is required in reliability management, such as the number of updates of data. The error correction and the reliability management are performed in each sector. Therefore, the management data include an ECC parity area and a spare area which are prepared for each sector. In this example, the ECC parity area and the spare area prepared for each sector have a data size of 32 bytes in total, for example. The main storing area and the spare area are areas which are writable and readable areas from the host apparatus 500. ECC parity generated by the controller 200 is written in the ECC parity area if the ECC circuit 295 is in a valid state. If the ECC circuit 295 is in an invalid state, EDD data generated by the host apparatus 500 may be written in the ECC parity area, or other data may be written therein.

The row decoder 120 decodes a row address for designating a row of the memory cell array 110. A word line is selected based on a decoded result, and voltages which are required to write, read, and erase data are applied thereto.

During reading of data, the sense amplifier 130 senses data read from the memory cell array 110 and transmits the data to the data register 140. During writing of data, data in the data register 140 are transmitted to the memory cell array 110.

The data register 140 temporarily holds write data or read data corresponding to one page.

The column decoder 150 decodes a column address of a column of the memory cell array 110. Based on a decoded result, data transmitted to the data register 140 during writing of data, and data are read from the data register 140 during reading of data.

The logic circuit 470 receives the signals /CE, CLE, ALE, /WE, /RE, and /WP from the controller 200.

The input/output control circuit 460 receives a signal IO [n:0]. If the signal IO is an address (if ALE="H"), the input/output control circuit 460 holds the address in the address register 420. If the signal IO is a command (if CLE="H"), the command is held in the command register 430. If the signal IO is data (if ALE=CLE="L"), the data are held in the data register 480.

The status register 410 holds various kinds of status information of the NAND-type flash memory 100. The status information includes information indicating whether or not a writing operation and a reading operation is successful (passed) or unsuccessful (failed), provided from the control circuit 440.

The control circuit 440 controls the entire NAND-type flash memory 100 based on commands held in the command register 430 and various signals input to the logic circuit 470. The control circuit 440 generates the ready busy signal /RB and outputs the signal to the controller 200.

The voltage generation circuit 450 generates voltage required in data writing, reading and erasing operations based on a command from the control circuit 440, and supplies the voltages to the memory cell array 110, the row decoder 120, and the sense amplifier 130.

1.1.4 Configuration of Data Buffers 260 and 270 Corresponding to State of ECC Circuit 295

Next, a configuration of the data buffers 260 and 270 corresponding to a state of the ECC circuit 295 will be described.

Figure 8:
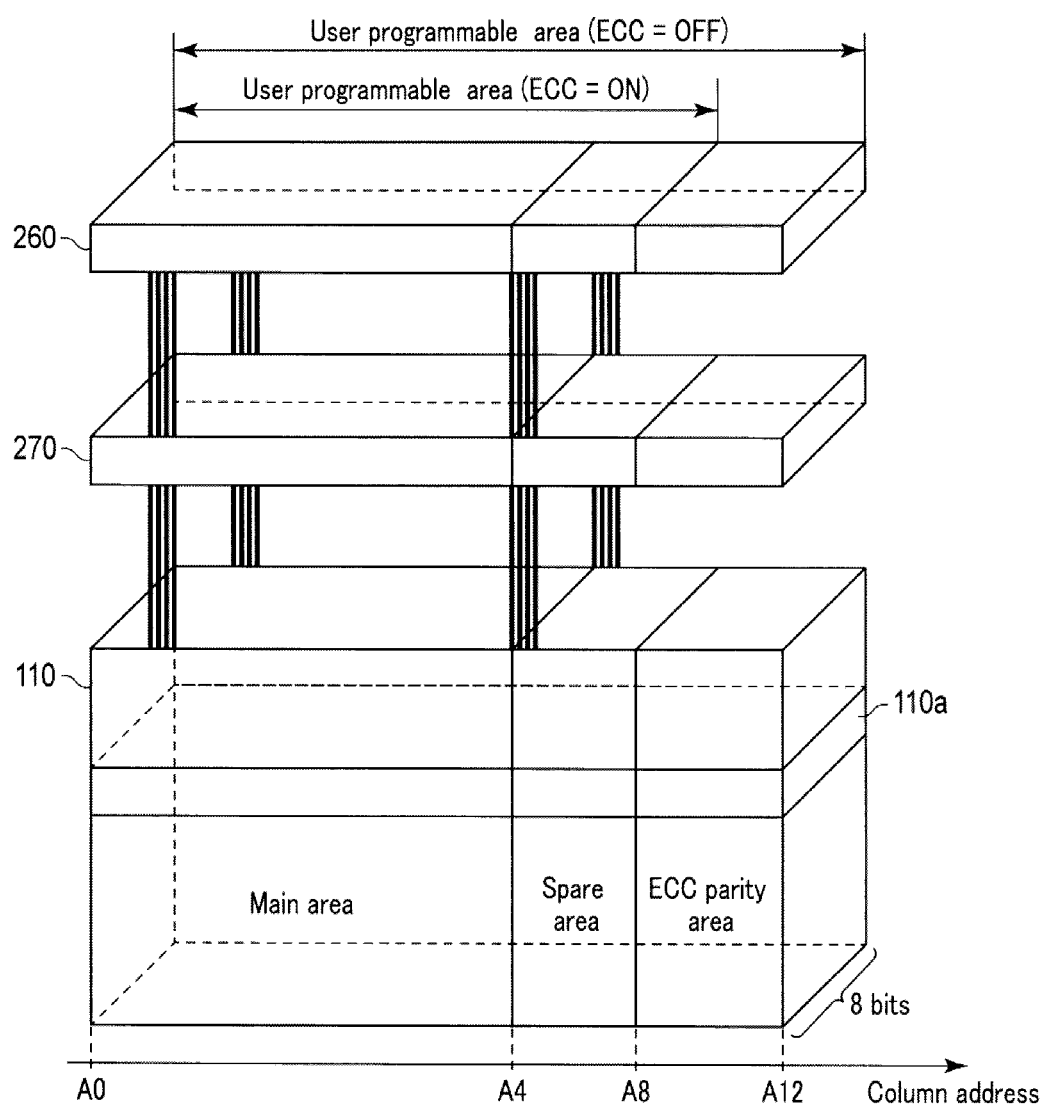
FIG. 8 is a schematic diagram illustrating a cell layout of the memory system according to the embodiment.

First, with reference to FIG. 8, an area which is writable area from the host apparatus 500 in the data buffers 260 and 270 will be described. FIG. 8 is a schematic diagram illustrating a cell layout of the memory system 1 corresponding to the state of the ECC circuit 295. As illustrated, in the data buffers 260 and 270, the maximum value of column addresses corresponding to areas in which data received from the host apparatus 500 is writable is changed depending on whether the state of the ECC circuit 295 is a valid state or an invalid state. More specifically, if the state of the ECC circuit 295 is a valid state, a range of a column address x which is writable from the host apparatus 500 is a range (A0≤x<A8) including the main storing area (A0≤x<A4) and the spare area (A4≤x<A8). If the state of the ECC circuit 295 is an invalid state, a range of the column address x which is writable from the host apparatus 500 is a range (A0≤x<A12) further including the ECC parity area (A8≤x<A12). Here, for example, if A0 is set as 0, A4 is 2048, A8 is 2112, and A12 is 2176.

Figure 9:
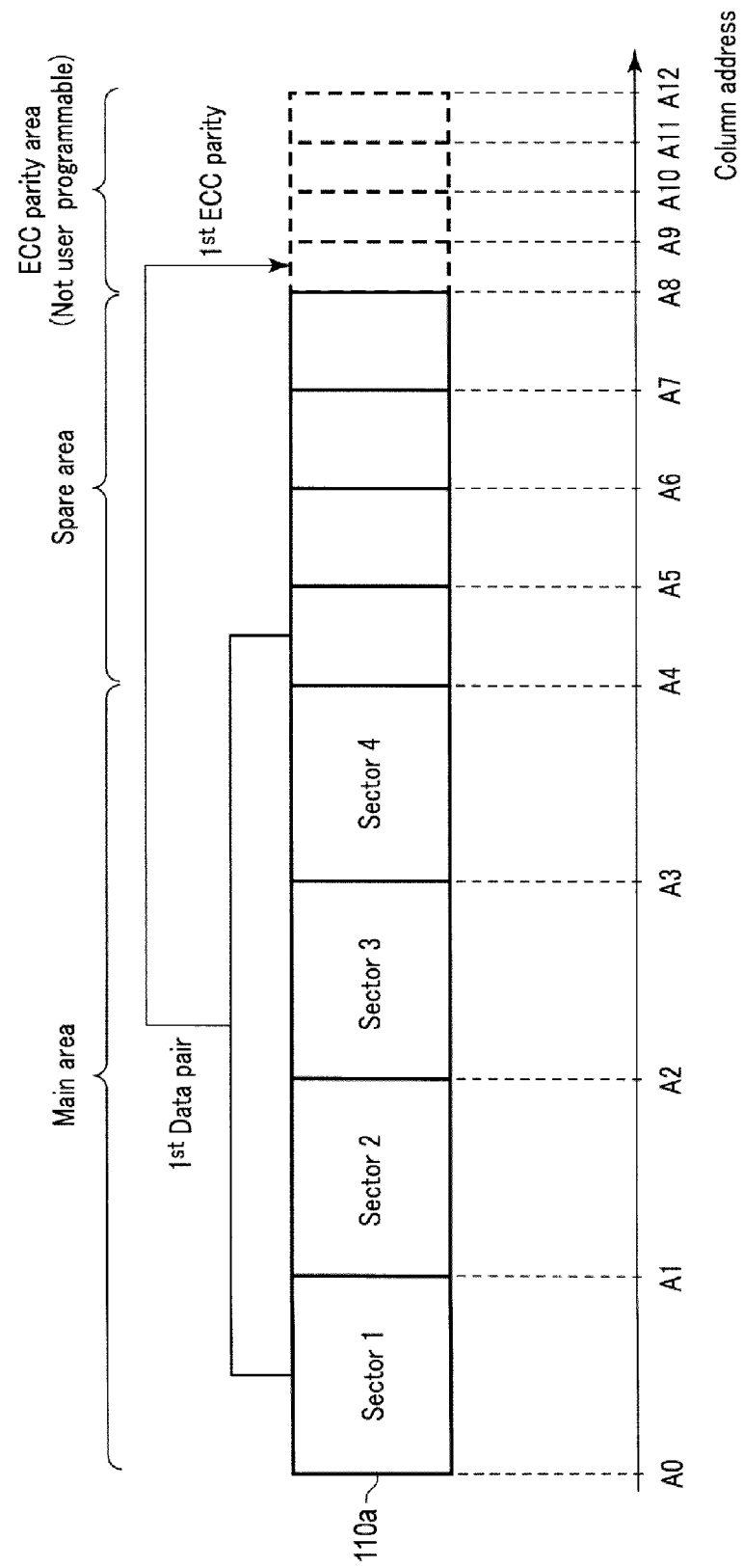
FIG. 9 is a schematic diagram illustrating a page configuration of the memory system according to the embodiment.
Figure 10:
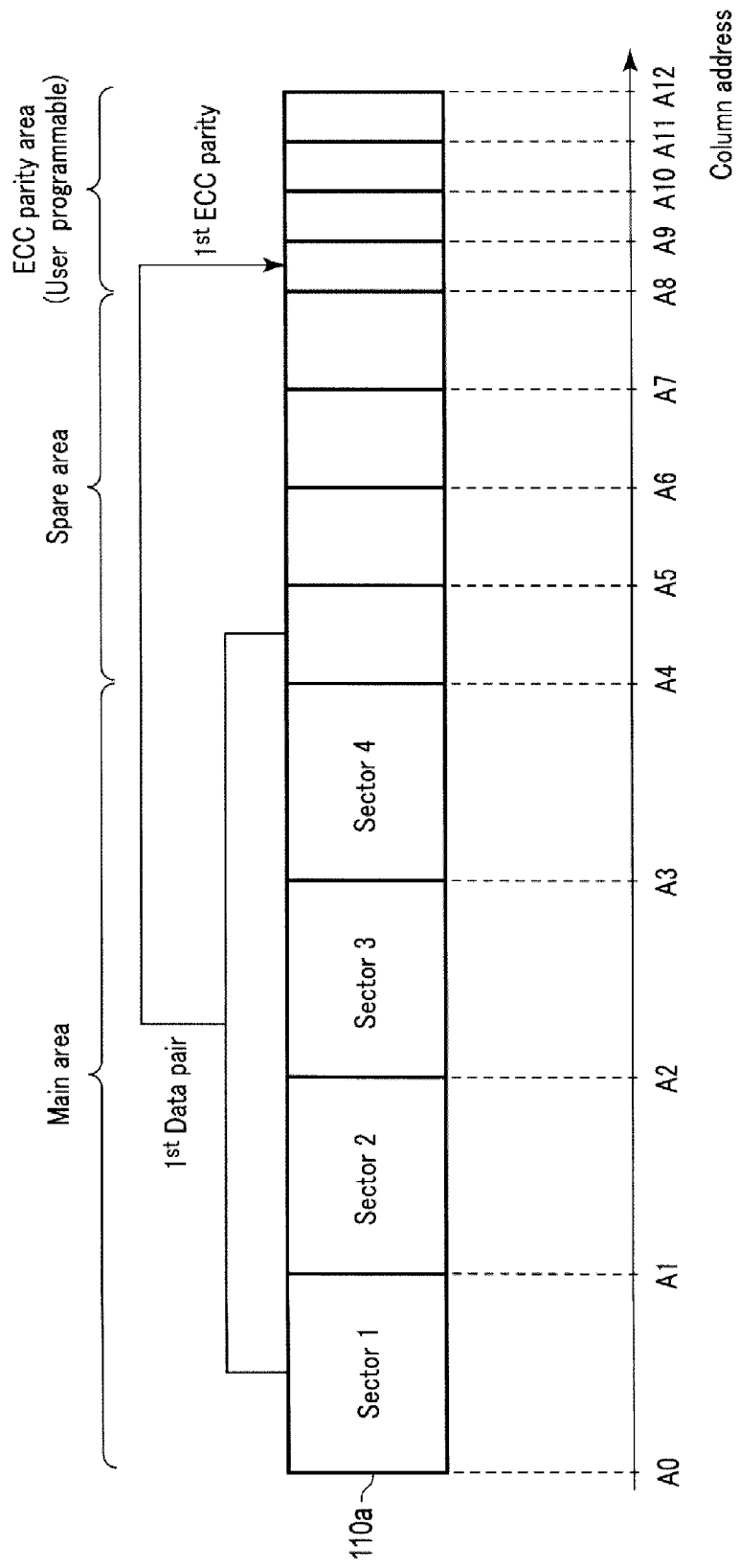
FIG. 10 is a schematic diagram illustrating a page configuration of the memory system according to the embodiment.

Next, with reference to FIGS. 9 and 10, an example of a column address allocated to each storing area in the data buffers 260 and 270 and any page 110a, corresponding to the state of the ECC circuit 295 will be described. FIG. 9 schematically illustrates a configuration of the data buffers 260 and 270 and the page 110a when the ECC circuit 295 is in a valid state. FIG. 10 schematically illustrates a configuration of the data buffers 260 and 270 and the page 110a when the ECC circuit 295 is in an invalid state.

As illustrated in FIG. 9, if the state of the ECC circuit 295 is a valid state, the ECC parity area is an area which cannot be accessed by the host apparatus 500. In other words, the maximum value of the column address allocated to an area which is writable from the host apparatus 500 is reduced, and thus areas corresponding to the column addresses A8≤x<A12 are not writable and readable from the host apparatus 500. ECC parity generated by the ECC circuit 295 is written in the areas which correspond to the column addresses A8≤x<A12 and are not writable from the host apparatus 500, by the memory system 1.

On the other hand, as illustrated in FIG. 10, if the state of the ECC circuit 295 is an invalid state, the maximum value of the column address allocated to an area which is writable from the host apparatus 500 is increased, and thus the ECC parity is writable from the host apparatus 500. Therefore, for example, in the memory system 1, the host apparatus 500 receives data along with generated ECC parity instead of the ECC circuit 295, and can write data in the areas corresponding to the column addresses A8≤x<A12, and may write data in areas other than A8≤x<A12. As described above, in the memory cell array 110, the maximum value of column addresses corresponding to areas in which data is writable from the host apparatus 500 is changed depending on whether the state of the ECC circuit 295 is a valid state or an invalid state.

As illustrated in FIGS. 9 and 10, a range of the column address x allocated to each sector of the main storing area is A(n−1)≤x<A(n) for the n-th sector. Thus, a range of the column address x allocated to a spare area corresponding to each sector is A(n+3)≤x<A(n+4) for the n-th spare area. A range of the column address x allocated to an ECC parity area corresponding to each data pair is A(n+7)≤x<A(n+8) for the n-th ECC parity area. As described above, consecutive column addresses are set in the main storing area, the spare area, and the ECC parity area regardless of the state of the ECC circuit 295. In other words, consecutive values are set as column addresses corresponding to areas in which data received from the host apparatus 500 is writable, regardless of whether or not the state of the ECC circuit 295 is a valid state. The column address is information provided from the host apparatus 500, and areas having the consecutive column addresses are not necessarily physically consecutive areas.

1.2 Operations

Next, data reading, writing, and erasing operations in the memory system according to the present embodiment will be described, focusing on signals which are transmitted and received via the SPI buses and the NAND buses.

1.2.1 Reading Operation

First, the reading operation will be described. The reading operation substantially includes the following three steps.

(1) Reading of data from the NAND-type flash memory: Through this step, data are read from the NAND-type flash memory 100 to the controller 200.

(2) Feature table reading (referred to as Get feature in some cases): Through this step, whether the memory system 1 is in a busy state or a ready state is determined, that is, whether or not the operation in the step (1) is completed is determined.

(3) Reading of data from the controller 200: Through this step, the data read to the controller 200 in the step (1) are read to the host apparatus 500.

Figure 11:
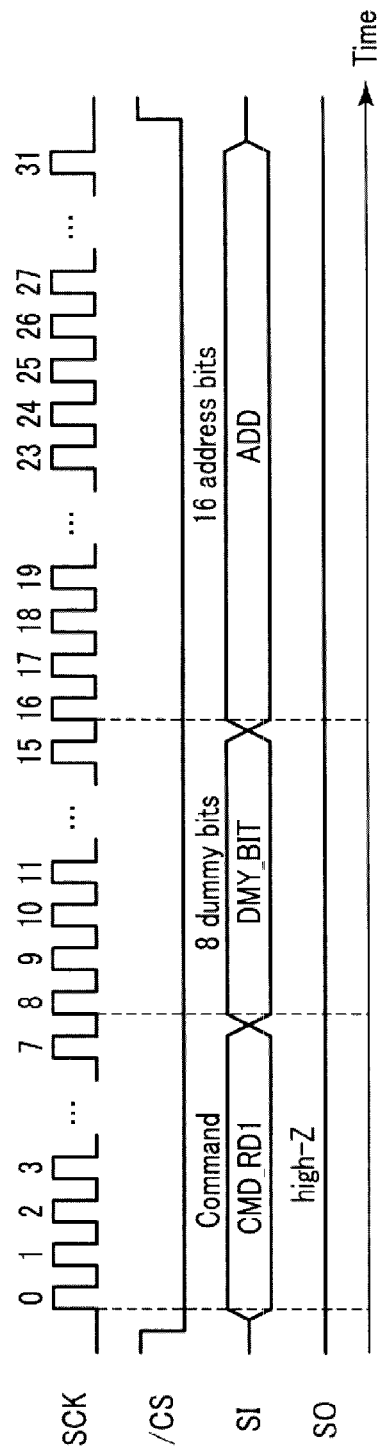
FIGS. 11-14 are timing charts of various signals during reading of data in the memory system according to the embodiment.

FIG. 11 is a timing chart of various signals on the SPI bus during execution of the step (1). As illustrated, the host apparatus 500 asserts the signal /CS, issues a first read command CMD_RD1 as the signal SI, and also issues the clock SCK.

The host interface circuit 220 of the controller 200 recognizes the signal SI when the signal /CS is asserted and the initial clock SCK is received, as a command. The command is, for example, an 8-bit signal which is input for 8 clock cycles. The first read command CMD_RD1 is received, and then the sequencer 250 starts a data reading sequence.

Next, the host apparatus 500 transmits dummy bits DMY_BIT to the controller 200, for example, for 8 clock cycles, and then transmits an address ADD to the controller 200, for example, for 16 clock cycles. After the address ADD is transmitted, the host apparatus 500 deasserts the signal/CS. The address ADD designates a block and a page in the NAND-type flash memory 100, and is held in the address register 290.

As described above, when a specific command is received, what kind of signal is subsequently input (command sequence) is defined in advance. In other words, for example, if the first read command CMD_RD1 is received, the controller 200 recognizes that the signal SI which is input for subsequent 8 clock cycles is meaningless dummy data, and the signal SI which is input subsequent 16 clock cycles is a substantial address signal.

Figure 12:
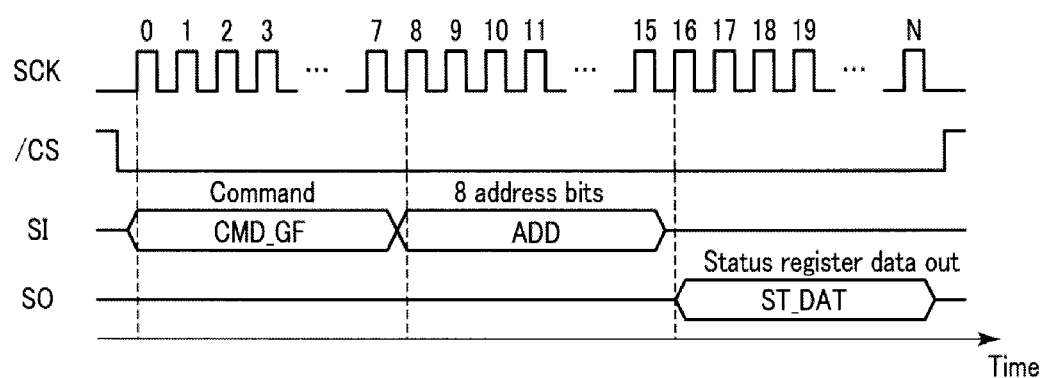

The operation in the step (2) is performed following the operation in the step (1). FIG. 12 is a timing chart of various signals on the SPI buses during execution in the step (2). As illustrated, the host apparatus 500 asserts the signal /CS again, issues a Get feature command CMD_GF as the signal SI, and also issues the clock SCK.

Next, the host apparatus 500 transmits an address ADD to the controller 200, for example, for 8 clock cycles. The address ADD is in the feature table, and naturally designates a region in which ready busy information is stored. In the controller 200, after the address ADD is received, the host interface circuit 220 reads an entry designated in the feature table from the status register 280 in response to a command from the sequencer 250, and transmits the entry to the host apparatus 500 as 8-bit status data ST_DAT for 8 clock cycles. The status data ST_DAT includes the ready busy information. After the status data ST_DAT is received, the host apparatus 500 deasserts the signal /CS.

Figure 13:
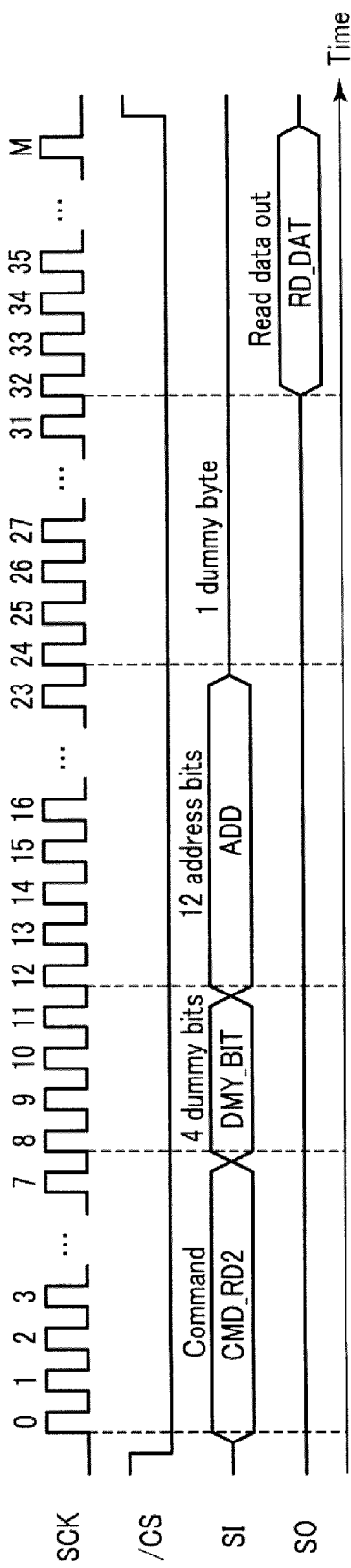

If the received status data ST_DAT indicates that the memory system 1 is in a ready state, the operation in the step (3) is performed. FIG. 13 is a timing chart of various signals on the SPI buses during execution of the step (3). As illustrated, the host apparatus 500 asserts the signal /CS, issues a second read command CMD_RD2 as the signal SI, and also issues the clock SCK.

Next, the host apparatus 500 transmits dummy bits DMY_BIT to the controller 200, for example, for 4 clock cycles, and then transmits an address ADD to the controller 200, for example, for 12 clock cycles. The address ADD designates a region in the data buffer 260 or 270 of the controller 200, and designates a column of a page in the NAND-type flash memory 100. The address ADD is held in the address register 290. Then, the host interface circuit 220 reads data from the data buffer 260 or 270, for example, under the control of the sequencer 250. After the 8 clock cycles, the host interface circuit 220 transmits the data RD_DAT read from the data buffer 260 or 270 to the host apparatus 500.

Figure 14:
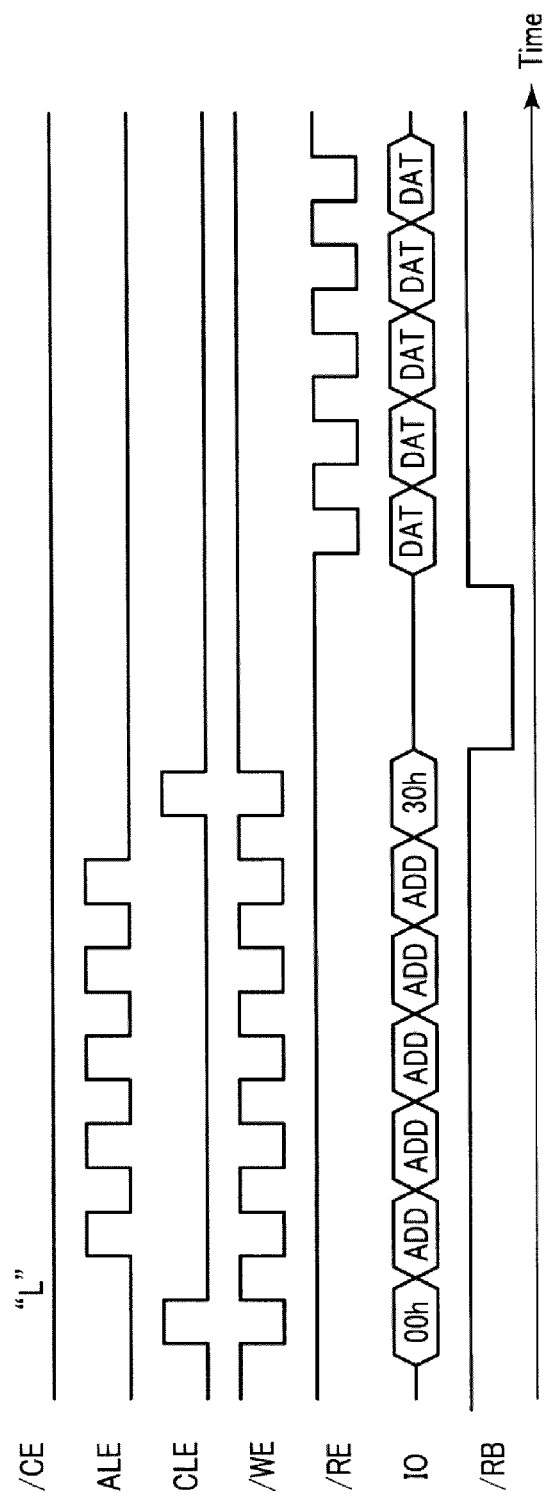

FIG. 14 is a timing chart of various signals on the NAND bus during execution of the step (1). After the first read command CMD_RD1 is received in the controller 200, the NAND interface circuit 230 issues an address input command "00h", for example, under the control of the sequencer 250, and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 11 and 13.

An operation of reading data from the memory cell array 110 is started in the NAND-type flash memory 100 in response to the command "30h", and thus the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

1.2.2 Writing Operation

Next, the writing operation will be described. The writing operation substantially includes the following three steps.

(1) Transmission of data from the host apparatus 500 to the controller 200

(2) Writing of the transmitted data in the NAND-type flash memory 100

(3) Feature table reading (Get feature): Through this step, whether writing of the data in the NAND-type flash memory 100 is passed or failed is determined.

FIG. 15 is a timing chart of various signals on the SPI buses during execution of the step (1). As illustrated, the host apparatus 500 asserts the signal /CS, issues a first write command CMD_WR1 as the signal SI, and also issues the clock SCK. If the first write command CMD_WR1 is received, the sequencer 250 starts a data writing sequence.

Next, the host apparatus 500 transmits dummy bits DMY_BIT to the controller 200, for example, for 4 clock cycles, and then transmits an address ADD to the controller 200, for example, for 12 clock cycles. The address ADD designates a region in the data buffer 260 or 270, and designates a column of a page in the NAND-type flash memory 100. The address ADD is held in the address register 290. The host apparatus 500 transmits write data WR_DAT to the controller 200. The write data WR_DAT is held in the region corresponding to the address ADD received right before, in the data buffer 260 or 270. After the data WR_DAT is transmitted, the host apparatus 500 deasserts the signal /CS.

The step (2) is performed following the step (1). FIG. 16 is a timing chart of various signals on the SPI bus during execution of the step (2). As illustrated, the host apparatus 500 asserts the signal /CS again, issues a second write command CMD_WR2 as the signal SI, and also issues the clock SCK. If the second write command CMD_WR2 is received, the sequencer 250 recognizes that a command for the step (2) is received.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates a block and a page in the NAND-type flash memory 100, and is held in the address register 290. After the address ADD is transmitted, the host apparatus 500 deasserts the signal/CS.

The step (3) is performed following the step (2). A command sequence in this operation is the same as in FIG. 12 referred to for description of the reading operation. If the received status data ST_DAT indicates that the memory system 1 is in a ready state, the host apparatus 500 subsequently makes a request for information indicating whether writing of data is passed or failed.

Figure 17:
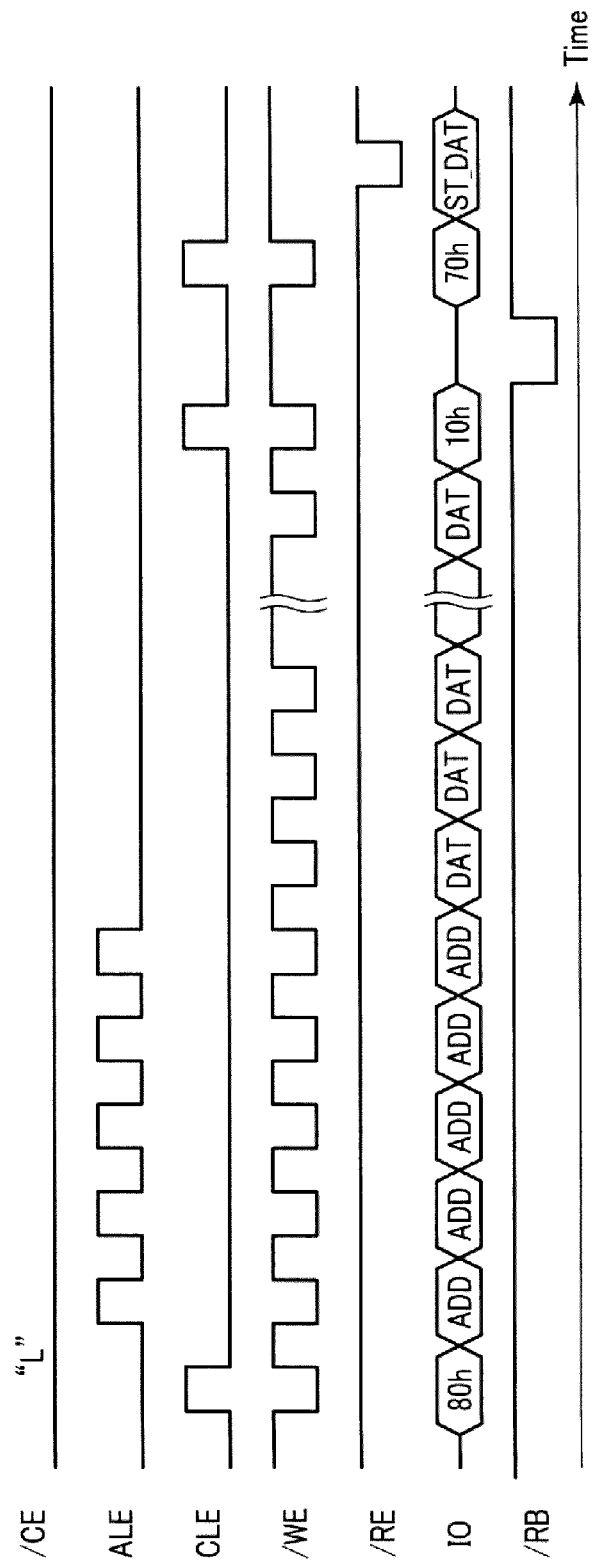

FIG. 17 is a timing chart of various signals on the NAND buses during execution of the step (2). After the second write command CMD_WR2 is received in the controller 200, the NAND interface circuit 230 issues a write command "80h", for example, under the control of the sequencer 250, and transmits the command to the NAND-type flash memory 100. Subsequently, an address ADD is transmitted to the NAND-type flash memory 100, for example, for 5 clock cycles, and write data DAT is transmitted to the NAND-type flash memory 100 for a plurality of clock cycles. Then, a write command "10h" is issued and transmitted to the NAND-type flash memory 100. The address ADD includes addresses indicating a block, a page, and a column, held in the address register 290 in the operations illustrated in FIGS. 15 and 16.

An operation of writing the data in the memory cell array 110 is started in the NAND-type flash memory 100 in response to the command "10h", and thus the NAND-type flash memory 100 is brought into a busy state (/RB="L").

If writing of the data in the memory cell array 110 is completed, the NAND-type flash memory 100 is brought into a ready state. The controller 200 reads a status, issues a command "70h", and toggles the signal /RE, in response thereto. Then, status data ST_DAT indicating whether the writing operation is passed or failed is transmitted to the controller 200 in synchronization with the signal /RE. The status data ST_DAT is held in the feature table, and is read to the host apparatus 500 in response to the Get feature command in the step (3).

1.2.3 Erasing Operation

Next, the erasing operation will be described. The erasing operation substantially includes the following two steps.

(1) An erase (delete) command is issued from the host apparatus 500 to the controller 200.

(2) Feature table reading (Get feature): Through this step, whether the erasing operation on the NAND-type flash memory 100 is passed or failed is determined.

Figure 18:
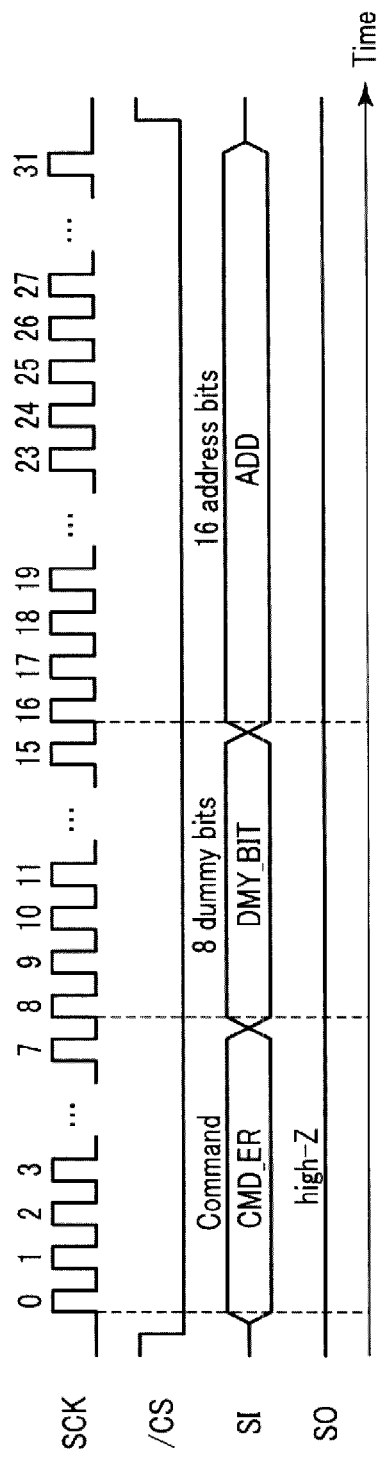

FIG. 18 is a timing chart of various signals on the SPI buses during execution of the step (1). As illustrated, the host apparatus 500 asserts the signal /CS, issues an erase command CMD_ER as the signal SI, and also issues the clock SCK. If the erase command CMD_ER is received, the sequencer 250 starts a data erasure sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates an erasure target block in the memory cell array 110, and is held in the address register 290. Subsequently, the host apparatus 500 deasserts the signal/CS.

The step (2) is performed following the step (1). A command sequence in this operation is the same as in FIG. 12 referred to for description of the reading operation. If the received status data ST_DAT indicates that the memory system 1 is in a ready state, the host apparatus 500 subsequently makes a request for information indicating whether erasure of the data is passed or failed.

FIG. 19 is a timing chart of various signals on the NAND buses during execution of the step (1). After the erase command CMD_ER is received in the controller 200, the NAND interface circuit 230 issues an erase command "60h", for example, under the control of the sequencer 250, and transmits the command to the NAND-type flash memory 100. Subsequently, an address ADD is transmitted to the NAND-type flash memory 100, for example, for 3 clock cycles, and then an erase command "D0h" is issued and is transmitted to the NAND-type flash memory 100.

An operation of erasing data from the memory cell array 110 is started in the NAND-type flash memory 100 in response to the command "D0h", and thus the NAND-type flash memory 100 is brought into a busy state (/RB="L").

If erasing of the data from the memory cell array 110 is completed, the NAND-type flash memory 100 is brought into a ready state. The controller 200 reads a status, issues a command "70h", and toggles the signal /RE, in response thereto. Then, status data ST_DAT indicating whether the erasing operation is passed or failed is transmitted to the controller 200 in synchronization with the signal /RE. The status data ST_DAT is held in the feature table, and is read to the host apparatus 500 in response to the Get feature command during the step (2).

1.3 Details of Writing and Reading Operations Depending on Set State of ECC Circuit 295

Next, details of the writing operation and the reading operation when the ECC circuit 295 is in a valid state and an invalid state will be described.

1.3.1 Feature Table

FIG. 20 conceptually illustrates the feature table according to the present embodiment. As illustrated, the feature table includes two entries, and each entry has an 8-bit length. The entries are respectively allocated with addresses "B0h" and "C0h".

The following information is allocated to the entry related to the address "B0h" from the lowest bit in order.

Bit 0=reserved

Bit 1=high speed mode enable (HSE): This bit is a flag indicating whether a mode for reading data at a high speed is enabled or disabled, and indicates the disabled state with "0" and the enabled state with "1".

Bit 2=bad block inhibit (BBI): This bit is a flag indicating whether a function of inhibiting writing and erasing of data on a block which cannot be used is enabled or disabled, and indicates the disabled state with "0" and the enabled state with "1".

Bit 3=reserved

Bit 4=ECC enable (ECC_E): This bit is a flag indicating whether or not the ECC circuit is in a valid state or an invalid state, and indicates the invalid state with "0" and the valid state with "1". If power is supplied, "1" is automatically set.

Bit 5=reserved

Bit 6=ID read enable (IDR_E): This bit is a flag indicating whether a function of reading a set value of ID information of the memory system 1 is enabled or disabled, and indicating the disabled state with "0" and the enabled state with "1".

Bit 7=block protect enable (PRT_E): This bit is a flag indicating whether a function of inhibiting writing and erasing of data on a specific block is enabled or disabled, and indicates the disabled state with "0" and the enabled state with "1".

The entry related to the address "C0h" is as follows.

Bit 0=operation in progress (OIP): This bit is a flag indicating whether the memory system 1 is in a ready state or a busy state, and indicates the ready state with "0" and the busy state with "1"

Bit 1=write enable latch (WEL): This bit is a flag indicating whether writing of data is enabled or disabled, and indicates the disabled state with "0" and the enabled state with "1".

Bit 2=erase fail (ERS_F): This bit is a flag indicating whether or not a data erasing operation is failed, and indicates pass with "0" and failure with "1".

Bit 3=program fail (PRG_F): This bit is a flag indicating whether or not a data writing operation is failed, and indicates pass with "0" and failure with "1"

Bits 4 and 5=ECC status (ECCS): These bits indicate an error correction result in the ECC circuit 295, for example, as illustrated in FIG. 21 through a combination of values of ECCS0 and ECCS1. In other words, (ECCS1, ECCS0)="00" indicates that no error is detected. "01" and "11" indicate that an error is corrected. "10" indicates that an error cannot be corrected.

Bits 6 and 7=reserved

The feature table is generated by, for example, the sequencer 250, based on information provided from the NAND interface circuit 230 or the host interface circuit 220, and is held in, for example, the status register 280.

1.3.2 Set Feature Command

A Value ECC_E may be arbitrarily set by the host apparatus 500 based on a feature table set command (also referred to as a Set feature command).

Figure 22:
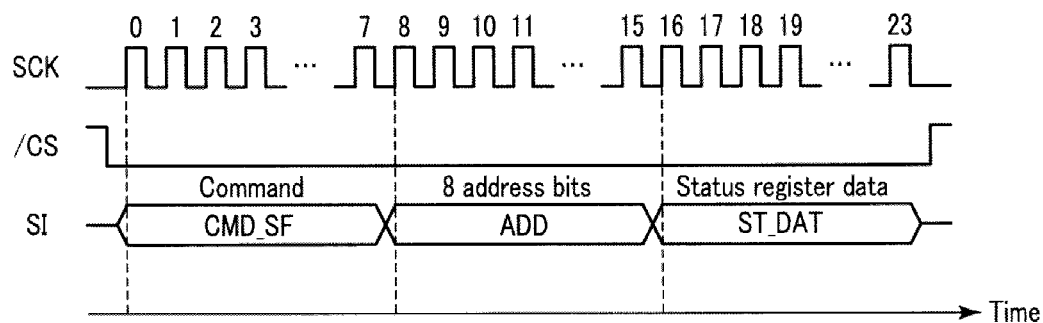
FIG. 22 is a timing chart of various signals during setting of information in the feature table according to the embodiment.
Figure 23:
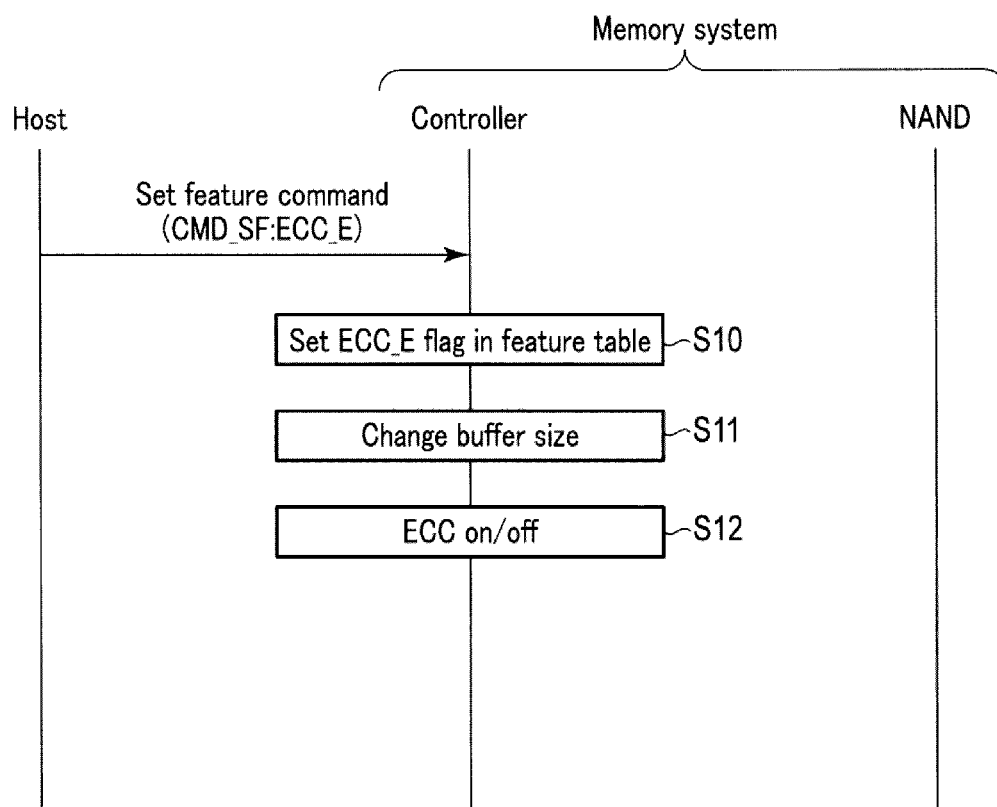
FIG. 23 is a flowchart illustrating an operation of the memory system according to the embodiment during ECC setting.

FIG. 22 is a timing chart of various signals on the SPI buses when a value of ECC_E is set in the feature table. FIG. 23 is a flowchart illustrating operations of the host apparatus 500, the controller 200, and the NAND-type flash memory 100.

As illustrated, the host apparatus 500 asserts the signal /CS, issues the Set feature command CMD_SF as the signal SI, and issues the clock SCK. Next, the host apparatus 500 transmits an address ADD to the controller 200, for example, for 8 clock cycles. The address ADD is an address in the feature table, and is "B0h" in FIG. 20. Subsequently, the host apparatus 500 transmits 8-bit data ST_DAT held in the entry corresponding to the address "B0h" in the feature table. The upper 4 bits in the 8-bit data ST_DAT are ECC_E. Then, in step S10, the sequencer 250 writes the data ST_DAT in the designated entry in the feature table.

Next, in step S11, the sequencer 250 changes sizes of the data buffers 260 and 270. More specifically, if the ECC circuit 295 is changed from a valid state to an invalid state, the sequencer 250 increases the maximum value of the column address for designating an area which is writable from the host apparatus 500 in the data buffers 260 and 270. If the ECC circuit 295 is changed from an invalid state to a valid state, the sequencer 250 reduces the maximum value.

Subsequently, in step S12, the sequencer 250 changes a state of the ECC circuit 295 from a valid state to an invalid state, or from an invalid state to a valid state.

Consequently, the host apparatus 500 can arbitrarily set ECC_E, and can change an area which is writable from the host apparatus 500 in the memory system 1 according to the state of ECC_E.

1.3.3 Flow of Writing Operation

Figure 24:
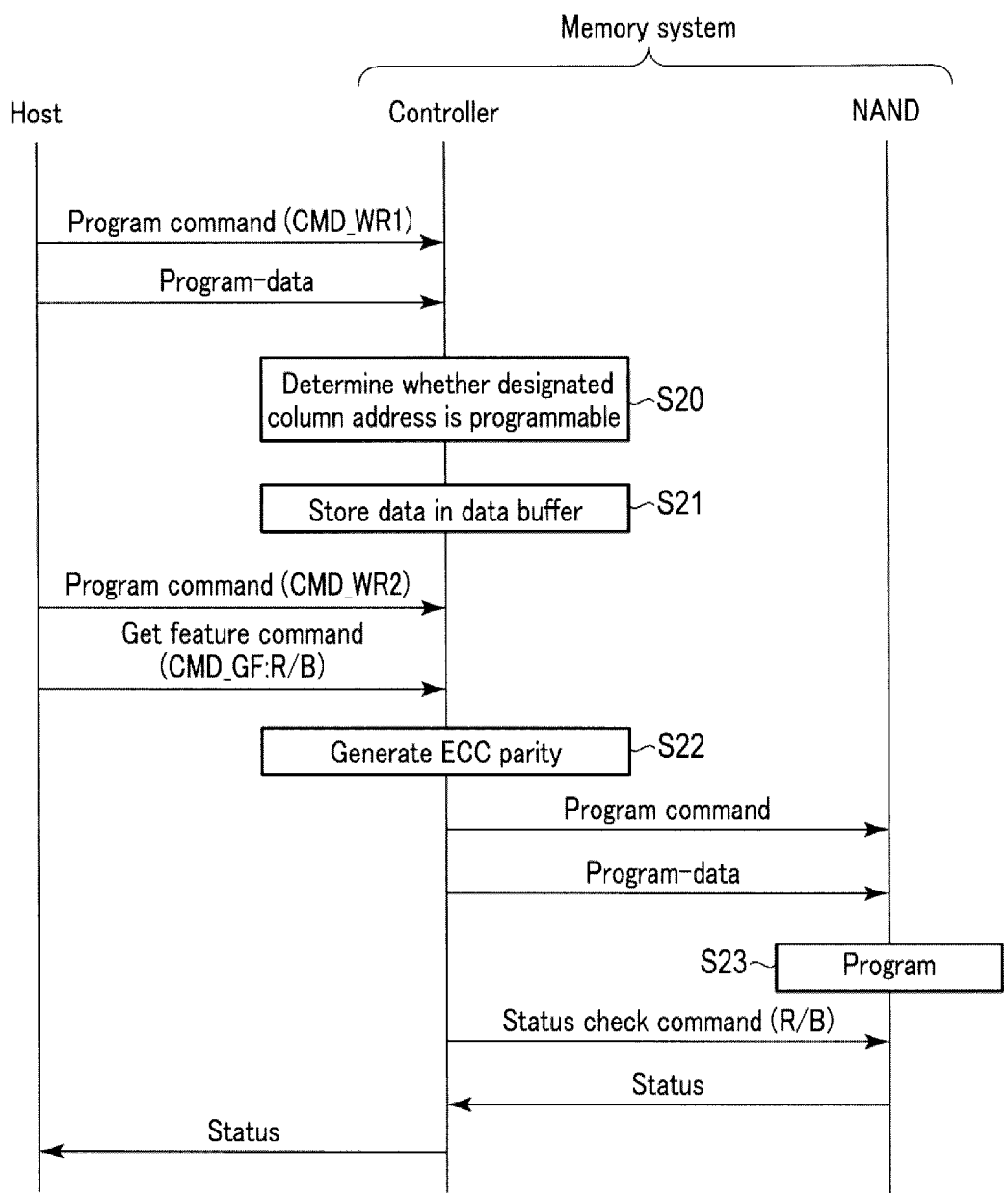
FIG. 24 is a flowchart illustrating a writing operation in the memory system according to the embodiment.
Figure 25:
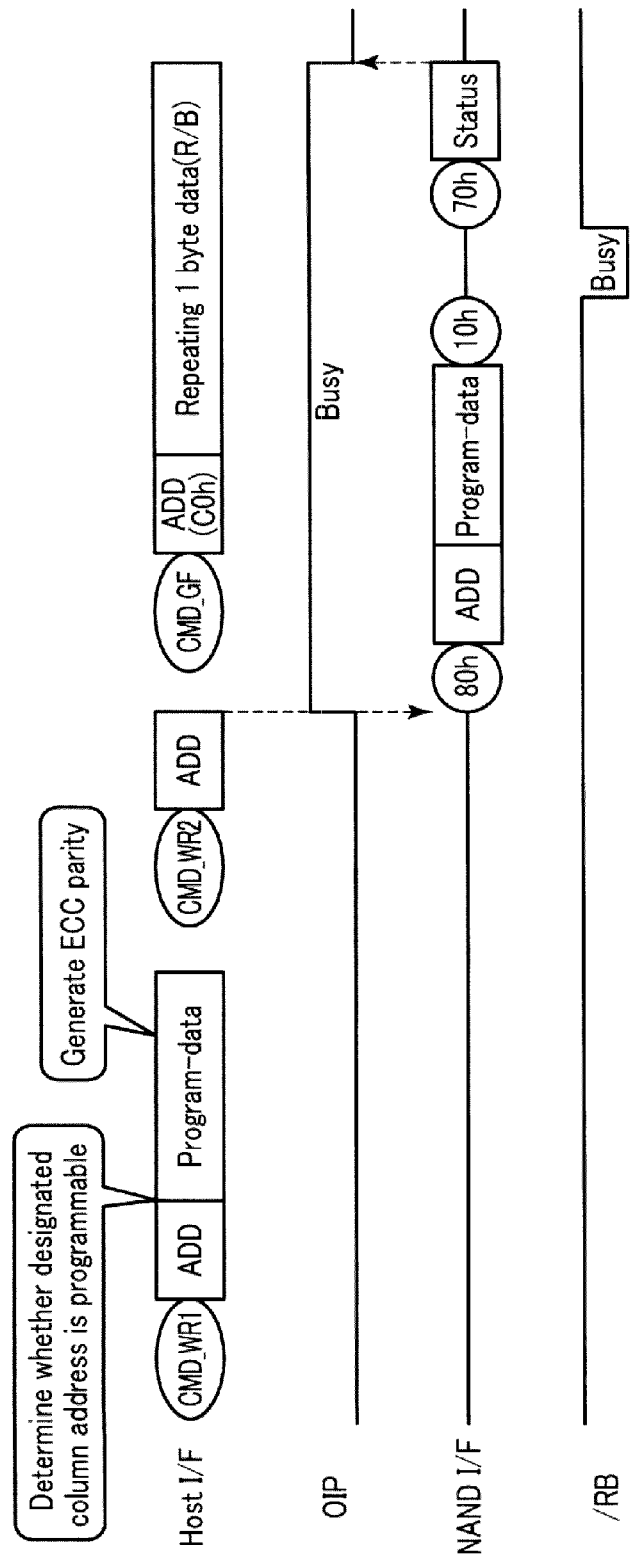
FIG. 25 illustrates a command sequence during the writing operation in the memory system according to the embodiment.

Next, details of the writing operation will be described with reference to FIGS. 24 and 25. FIG. 24 is a flowchart illustrating operations of the host apparatus 500, the controller 200, and the NAND-type flash memory 100 during the writing operation if the ECC circuit 295 is in a valid state. FIG. 25 illustrates a command sequence.

As illustrated, first, the host apparatus 500 issues the first write command CMD_WR1, and then an address ADD, and also transmits write data. In step S20, the sequencer 250 determines whether or not the address ADD designated from the host apparatus 500 corresponds to a column address which is writable in the data buffers 260 and 270. In step S21, the sequencer 250 stores the received data in the data buffers 260 and 270 based on a determination result. More specifically, if the address is determined as corresponding to the writable address, the sequencer 250 stores the received data in the data buffers 260 and 270 without being changed. However, if the address is determined as not corresponding to the writable address, the sequencer 250 disregards data corresponding to a column address in which the data is inhibited from being written in the received data, and stores data in a writable area of the data buffers 260 and 270.

Next, the host apparatus 500 issues the second write command CMD_WR2 and subsequently issues an address ADD. In response to the address ADD, the memory system 1 is brought into a busy state, and the OIP in the feature table becomes "1". The host apparatus 500 issues the Get feature command CMD_GF and an address ADD (="C0h"), and reads information (1-byte data) regarding the entry including the OIP from the feature table. The entry information is repeatedly transmitted to the host apparatus 500 until the OIP becomes "0" while the clock SCK is input (the Get feature command may be repeatedly issued).

In step S22, when the memory system 1 is brought into a busy state, the controller 200 generates ECC parity and data to be written in the NAND-type flash memory 100. Subsequently, the controller 200 issues a command "80h", an address ADD, write data, and a command "10h" to the NAND-type flash memory 100. Consequently, the NAND-type flash memory 100 is brought into a busy state. In step S23, the data and the ECC parity are written in the memory cell array 110. If the state of the ECC circuit 295 is an invalid state, computation of ECC parity is not performed.

Subsequently, the NAND-type flash memory 100 is brought into a ready state. Next, the controller 200 issues a command "70h". Then, in response to the command, the NAND-type flash memory 100 outputs a write status indicating whether the writing operation is passed or failed, to the controller 200.

If the write status is transmitted from the NAND-type flash memory 100 to the controller 200, the memory system 1 is brought into a ready state, and, for example, the sequencer 250 sets the OIP "1" in the feature table as "0". The sequencer 250 holds the write status in the feature table so that the host apparatus 500 can read data.

1.3.4 Flow of Reading Operation

Next, details of the reading operation performed when the ECC circuit 295 is in a valid state and an invalid state will be described.

Figure 26:
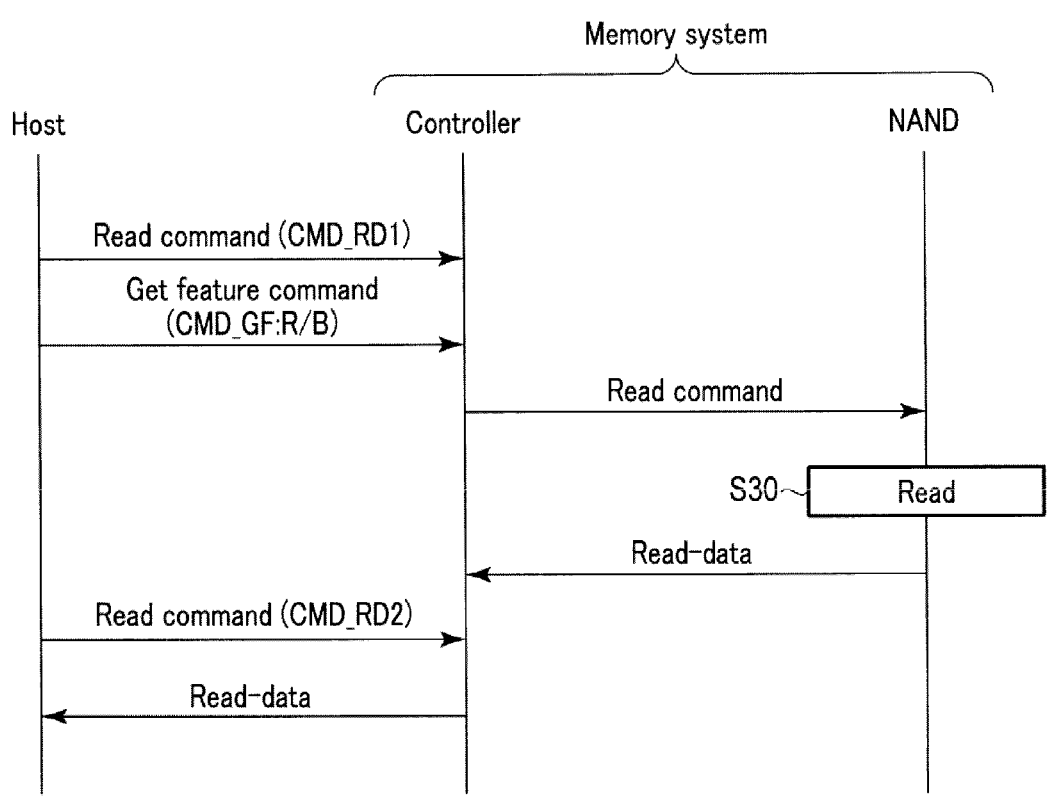
FIG. 26 is a flowchart illustrating a reading operation in the memory system according to the embodiment.
Figure 27:
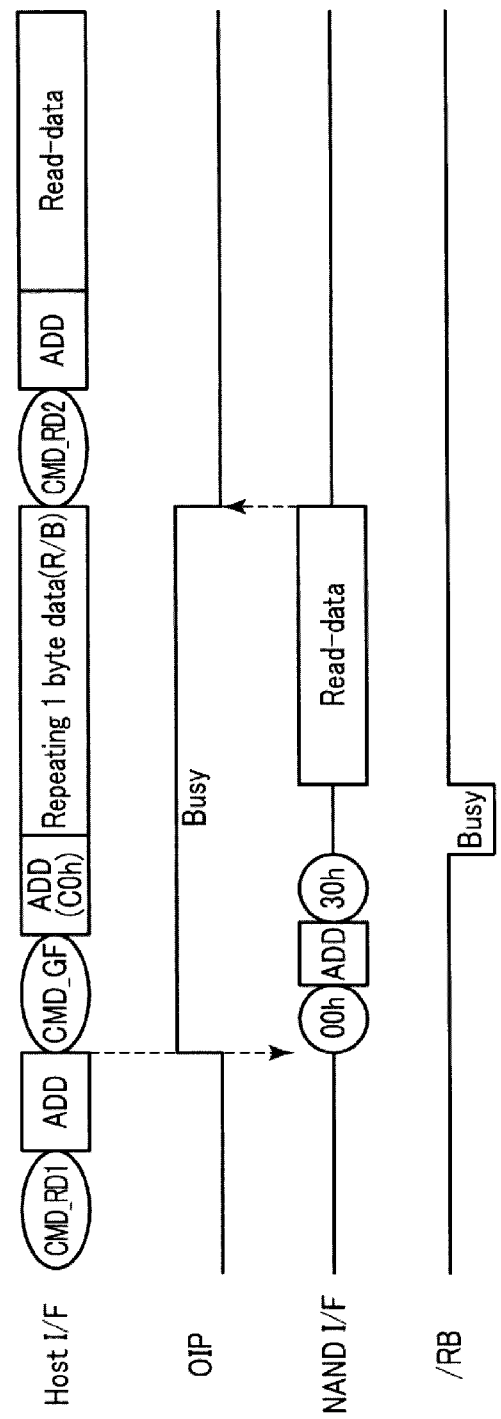
FIG. 27 illustrates a command sequence during the reading operation in the memory system according to the embodiment.

First, a reading operation performed when the ECC circuit 295 is in an invalid state will be described. FIG. 26 is a flowchart illustrating operations of the host apparatus 500, the controller 200, and the NAND-type flash memory 100 during the reading operation when ECC is invalid, and FIG. 27 illustrates a command sequence.

As illustrated, first, the host apparatus 500 issues the first read command CMD_RD1 and then an address ADD. In response to the address ADD, the memory system 1 is brought into a busy state, and the OIP in the feature table becomes "1". The host apparatus 500 issues the Get feature command CMD_GF and an address ADD (="C0h"), and reads information (1-byte data) regarding the entry including the OIP from the feature table. The entry information is repeatedly transmitted to the host apparatus 500 until the OIP becomes "0" (the Get feature command may be repeatedly issued).

When the memory system 1 is brought into a busy state, the controller 200 issues a command "00h", an address ADD, and a command "30h" to the NAND-type flash memory 100. Consequently, the NAND-type flash memory 100 is brought into a busy state. In step S30, data are read from the memory cell array 110. Next, the NAND-type flash memory 100 is brought into a ready state, and the read data are transmitted to the controller 200.

If the read data are transmitted to the controller 200 from the NAND-type flash memory 100, the memory system 1 is brought into a ready state, and the sequencer 250 sets the OIP "1" in the feature table as "0".

The host apparatus 500 issues the second read command CMD_RD2, and reads the data read from the NAND-type flash memory 100, from the controller 200.

Figure 28:
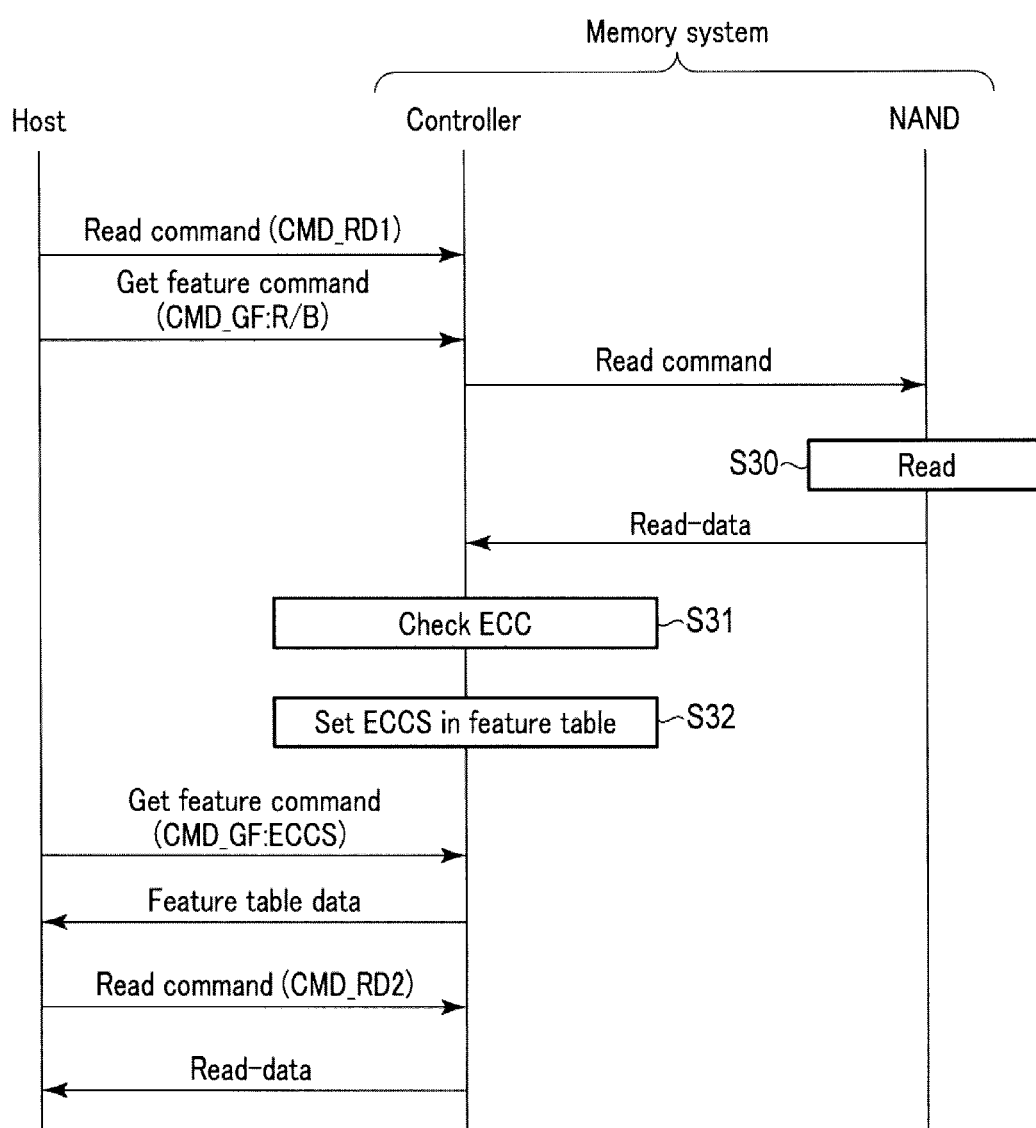
FIG. 28 is a flowchart illustrating the reading operation in the memory system according to the embodiment.
Figure 29:
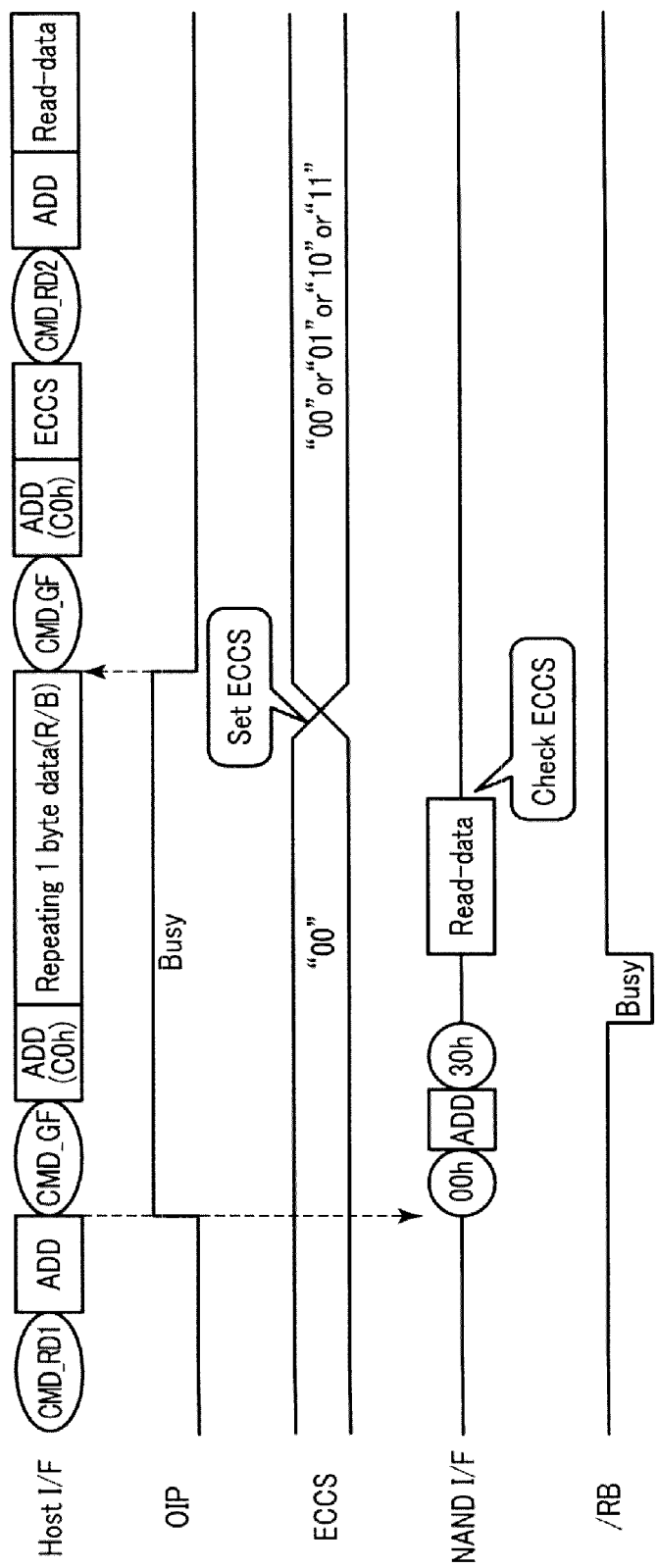
FIG. 29 illustrates a command sequence during the reading operation in the memory system according to the embodiment.

Next, a reading operation performed when ECC is valid will be described. FIG. 28 is a flowchart illustrating operations of the host apparatus 500, the controller 200, and the NAND-type flash memory 100 during the reading operation when ECC is valid, and FIG. 29 illustrates a command sequence.

As illustrated, first, the host apparatus 500 issues the first read command CMD_RD1, and data are read from the memory cell array 110 in step S30. Operations up to step S30 are the same as the operations performed when ECC is invalid, and thus description thereof will be omitted.

Subsequently, in step S31, the ECC circuit 295 detects an error from the read data, and corrects the error if the error is detected. If net data are written in an area in which ECC parity is to be stored, the ECC circuit 295 detects an error, but does not perform correction except that the net data accidentally matches the ECC parity. As such a situation, it is assumed that data are written when the ECC circuit 295 is set to an invalid state, and then the data are read after the state of the ECC circuit 295 is changed to a valid state.

Subsequently, the NAND-type flash memory 100 is brought into a ready state, and the read data are transmitted the controller 200. Next, the controller 200 stores a correction result of an error in each sector, detected in the ECC process in step S31, in the feature table.

If the error correction result is transmitted to the feature table, the memory system 1 is brought into a ready state, and, for example, the sequencer 250 sets the OIP "1" in the feature table as "0".

In step S32, the sequencer 250 sets a corresponding ECCS flag in the feature table based on the error correction result in each sector. If net data are written in an area in which ECC parity is to be stored, the ECCS is set as "10" which shows the host apparatus 500 that an error is detected, but is not corrected, except for a case where the net data accidentally matches the ECC parity.

In response to the OIP becoming "0", the host apparatus 500 issues the Get feature command CMD_GF and the address ADD (="C0h"), and reads information regarding an entry including ECCS from the feature table.

The host apparatus 500 issues the second read command CMD_RD2, and reads corrected data from the controller 200 if error correction is performed by the ECC circuit 295. The host apparatus 500 reads uncorrected data from the controller 200 if error correction is not performed by the ECC circuit 295.

1.4 Advantage of Present Embodiment

According to the present embodiment, an area which is writable from a host apparatus can be appropriately set. The following advantage will be obtained.

In the NAND-type flash memory, an error bit is generated in some of written data (a bit is reversed). For this reason, if the NAND-type flash memory is used, the data error is generally corrected through ECC.

ECC parity which is generated by the ECC circuit in order to correct an error is written in the ECC parity area which is a part of the management area provided in each page. If the ECC circuit is built into the NAND-type flash memory and a state of the ECC circuit is a valid state, the ECC parity is written in the ECC parity area by the NAND-type flash memory. On the other hand, if the ECC circuit is not built thereinto, or a state of the ECC circuit is an invalid state, the ECC parity is written in the ECC parity area by the host apparatus 500.

In terms of this point, in the memory cell array 110 according to the present embodiment, the maximum value of column addresses corresponding to areas in which data is writable from the host apparatus 500 is changed according to whether setting information for the ECC circuit 295 is a valid state or an invalid state. Therefore, an area which is writable from the host apparatus 500 can be appropriately set while securing an area in which ECC parity is held, depending on whether a state of the ECC circuit 295 is a valid state or an invalid state.

Column addresses corresponding to areas in which data designated from the host apparatus 500 are set to be consecutively observed from the host apparatus 500 regardless of a state of the ECC circuit 295. Therefore, the host apparatus 500 can simplify a data writing procedure compared with a case where writable areas are distributed in a discrete manner.

The sequencer 250 determines whether or not a column address designated from the host apparatus corresponds to a column address which is writable from the host apparatus, and writes data in only a writable area if it is determined that the column address does not correspond thereto. Therefore, even if there is an instruction for writing data in an area which is not writable from the host apparatus 500 due to a change in a writable area corresponding to a state of the ECC circuit 295, data can be written in an appropriate area.

2. Modification Examples and the Like

As described above, the memory system according to the embodiment includes the first pin that can receive the chip select signal from the host apparatus; the second pin that can output the first signal to the host apparatus; the third pin that can receive the second signal from the host apparatus; the fourth pin that can receive the clock from the host apparatus; the interface circuit that recognizes, as a command, the second signal which is received by the third pin immediately after the asserted chip select signal is received; the memory cell array that includes the memory cell which can hold data and in which the data is written in the page unit; and the ECC circuit that generates ECC parity of data to be written in the memory cell array and corrects an error of the data. The interface circuit can receive setting information for setting the ECC circuit to a valid state or an invalid state, from the host apparatus. In the memory cell array, the maximum value of column addresses corresponding to areas in which data is writable is changed according to the setting information.

Alternatively, column addresses corresponding to areas in which data is writable are set to be consecutively observed from the host apparatus regardless of the setting information.

According to the present configuration, a user's convenience can be improved.

Embodiments are not limited to the above-described embodiment and may have various modifications. For example, in the above-described embodiment, the ECC parity area is not readable if a state of the ECC circuit 295 is a valid state. However, the ECC parity held in the ECC parity area can be read regardless of a state of the ECC circuit 295. Consequently, even if the ECC circuit 295 is set in a valid state, the host apparatus 500 can read the ECC parity stored in the ECC parity area.

In the above embodiment, the sequencer 250 of the controller 200 determines whether or not a column address designated from the host apparatus 500 corresponds to a writable column address, and writes data in only a writable area if it is determined that the column address does not correspond to the writable column address. Alternatively, the control circuit 440 of the NAND-type flash memory 100 may have the function.

In the above embodiment, the ECC circuit 295 is built into the controller 200. However, the ECC circuit 295 may not be included in the controller 200 and may be included in the NAND-type flash memory 100.

Figure 30:
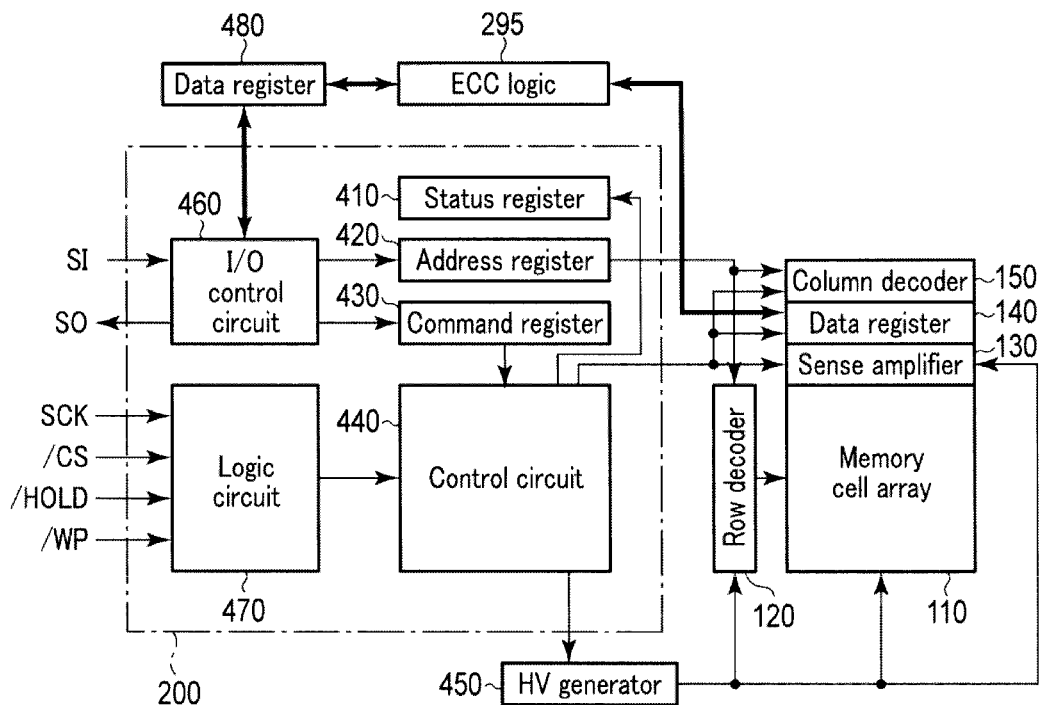
FIG. 30 is a block diagram of a memory system according to a modification example of the embodiment.

In the above-described embodiment, the NAND-type flash memory 100 and the controller 200 are separate semiconductor chips. Alternatively, the elements may be formed of one chip. FIG. 30 is a block diagram of the memory system 1 in this case.

As illustrated, a block configuration is the same as in FIG. 7 except that the ECC circuit 295 is additionally provided. In the memory system 1 in this case, the signals SCK, /CS, /HOLD, and /WP from the host apparatus 500 are input to the logic circuit 470, and the signals SI and SO are input and output via the input/output control circuit 460. The registers 410 and 430, the control circuits 440 and 460, and the logic circuit 470 function as the controller 200. In other words, the control circuit 440 functions as the sequencer 250 and the host interface circuit 220, and discriminates commands from the host apparatus 500 from each other by using the signal /CS. The input/output control circuit 460 and the logic circuit 470 function as the host input/output circuit 210. The registers 410 and 420 function as the registers 280 and 290, and the feature table is held in, for example, the status register 410 or the like. ECC parity generated by the ECC circuit 295 is directly transmitted to the data register 140, and status information output from the ECC circuit 295 is output to the status register 410.

Figure 31:
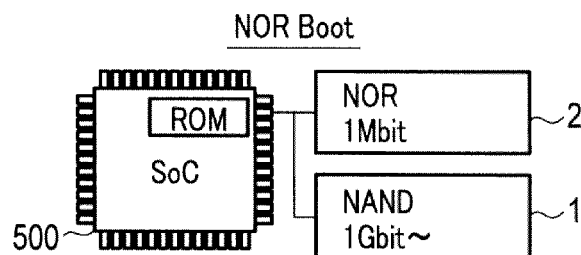
FIGS. 31 and 32 are each a conceptual diagram of a system using the memory system according to the embodiment.

The memory systems described in each of the above embodiments may be applied to, for example, a television set or a set top box. FIG. 31 illustrates an example of such a system. In the present example, a NOR-type flash memory 2 is provided in addition to the memory system 1. Both the memory system 1 and the NOR-type flash memory 2 are connected to an SPI interface. In the present example, commands (the commands CMD_RD1, CMD_RD2, CMD_GF, and CMD_SF, and the like) for controlling the memory system 1 are held in the NOR-type flash memory 2. During activation of the host apparatus 500, the host apparatus 500 reads the command information from the NOR-type flash memory 2 according to a sequence held in a ROM of the host apparatus 500. The host apparatus 500 reads an activation sequence from the memory system 1 by using the command information, and the application is activated by executing the activation sequence.

Figure 32:
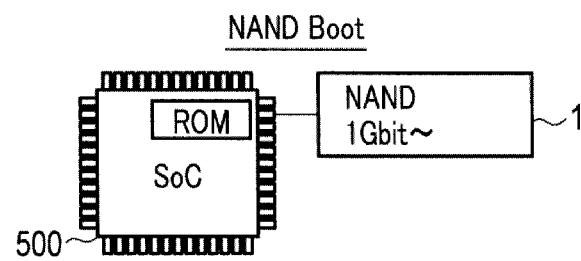

Alternatively, if the command information regarding the memory system 1 is held in the ROM of the host apparatus 500, the NOR-type flash memory 2 may be omitted as illustrated in FIG. 32.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
a semiconductor memory cell array including memory cells in pages, the memory cells arranged in rows and columns, memory cells in a same column connected to a same bit line, each memory cell in a page being assigned a column address from a continuous sequence of column addresses;
a controller circuit configured to communicate with a host through a serial interface, to receive write data from the host to be written to the semiconductor memory cell array as a page, and to store the write data in a data buffer before writing the write data to the semiconductor memory cell array as a page; and
an error-correcting code (ECC) circuit configured to generate an error correction code from the write data if the ECC circuit is in a valid state, wherein
when the ECC circuit is in the valid state and the controller circuit receives a first logical column address and first write data from the host, the controller circuit writes the first write data to a first physical column address of the data buffer, and writes the error correction code generated by the ECC circuit from the first write data to a second physical column address, the second physical column address being located within a first region of the data buffer, wherein data from the host cannot be written into the first region by the controller circuit when the ECC circuit is in the valid state, and the first physical column address being located within a second region of the data buffer, wherein data from the host can be written into the second region by the controller circuit when the ECC circuit is in the valid state, and
when the ECC circuit is in an invalid state and the controller circuit receives a third logical column address and second write data from the host, the controller circuit writes the second write data to a third physical column address of the data buffer, and writes the error correction code generated by the host from the second write data to a fourth physical column address of the data buffer, the third physical column address being located within the second region of the data buffer and the fourth physical column address being located within the first region of the data buffer.

2. The memory device according to claim 1, wherein operational settings of the ECC circuit are stored in the memory device and one of the operational settings is an ECC setting to set the ECC circuit to the valid state or the invalid state.

3. The memory device according to claim 2, wherein the ECC setting is settable through a command received from the host through the serial interface.

4. The memory device according to claim 1, wherein the serial interface conforms to Serial Peripheral Interface (SPI).

5. The memory device according to claim 1, the serial interface comprising:
a first pin through which a chip select signal can be received;
a second pin through which a clock signal can be received; and
a third pin through which a command can be received in synchronization with the clock signal, wherein
the controller circuit is configured to recognize, as the command, a signal received by the third pin immediately after the chip select signal is asserted.

6. The memory device according to claim 1, wherein the semiconductor memory cell array and the ECC circuit are disposed on a single semiconductor chip.

7. The memory device according to claim 1, wherein an addressable column address range of a page of memory cells to be written is varied according to whether the ECC circuit is set to the valid state or the invalid state.

8. The memory device according to claim 1, wherein the third physical column address is within a non-user programmable region dedicated to storage of ECC parity bits generated by the ECC circuit when the ECC circuit is in the valid state, and wherein, when the ECC circuit is in the invalid state and the ECC circuit detects an error in the second write data, the ECC circuit does not perform error correction on the second write data and sets an error correction signal to a predetermined state to indicate to the host that the second write data has an error that has not been corrected by the ECC circuit.

9. A semiconductor device, comprising:

a semiconductor memory cell array including memory cells in pages, the memory cells arranged in rows and columns, memory cells in a same column connected to a same bit line, each memory cell in a page being assigned a column address from a continuous sequence of column addresses;

a controller circuit configured to communicate with a host through a serial interface, to receive write data from the host to be written to the semiconductor memory cell array, and to store the write data in a data buffer before writing the write data to the semiconductor memory cell array as a page, the data buffer storing the write data in a plurality of data segments corresponding to adjacent ranges of column addresses in the continuous sequence of column addresses to which the write data is to be written in the semiconductor memory cell array; and an error-correcting code (ECC) circuit configured to generate an error correction code for write data stored in each of data segment of the data buffer if the ECC circuit is in a valid state, wherein when the ECC circuit is in the valid state and the controller circuit receives a first logical column address and first write data from the host, the controller circuit writes the first write data to a first physical column address of the data buffer, and writes the error correction code generated by the ECC circuit from the first write data to a second physical column address, the second physical column address being located within a first region of the data buffer, wherein data from the host cannot be written into the first region by the controller circuit when the ECC circuit is in the valid state, and the first physical column address being located within a second region of the data buffer, wherein data from the host can be written into the second region by the controller circuit when the ECC circuit is in the valid state, and when the ECC circuit is in an invalid state and the controller circuit receives a third logical column address and second write data from the host, the controller circuit writes the second write data to a third physical column address of the data buffer and writes the error correction code generated by the host from the second write data to a fourth physical column address of the data buffer, the third physical column address being located within the second region of the data buffer and the fourth physical column address being located within the first region of the data buffer.

10. The semiconductor device according to claim 9, wherein when the ECC circuit is in the valid state, the controller circuit writes the error correction codes generated for write data stored in each data segment of the data buffer in a region of the page having a column address higher than the first column address in the continuous sequence of column addresses.

11. The memory device according to claim 10, wherein operational settings of the ECC circuit are stored in the memory device and one of the operational settings is an ECC setting to set the ECC circuit to the valid state or the invalid state.

12. The memory device according to claim 11, wherein the ECC setting is settable through a command received from the host through the serial interface.

13. The memory device according to claim 9, wherein the serial interface conforms to Serial Peripheral Interface (SPI).

14. The memory device according to claim 9, the serial interface comprising:

a first pin through which a chip select signal can be received;

a second pin through which a clock signal can be received, and a third pin through which a command can be received in synchronization with the clock signal, wherein the controller circuit is configured to recognize, as the command, a signal received by the third pin immediately after the chip select signal is asserted.

15. A method of writing write data in a memory device including a semiconductor memory cell array including memory cells in pages, the memory cells arranged in rows and columns, memory cells in a same column connected to a same bit line, each memory cell in a page being assigned a column address from a continuous sequence of column addresses, a controller circuit configured to communicate with a host through a serial interface, to receive write data from the host to be written to the semiconductor memory cell array as a page, and to store the write data in a data buffer, and an error-correcting code (ECC) circuit configured to generate an error correction code from the write data if the ECC circuit is in a valid state, said method comprising:

when the ECC circuit is in the valid state, receiving a first logical column address and a first write data from the host, and writing the first write data to a first physical column address of the data buffer, and writing the error correction code generated by the ECC circuit from the first write data to a second physical column address, the second physical column address being located within a first region of the data buffer, wherein data from the host cannot be written into the first region by the controller circuit when the ECC circuit is in the valid state, and the first physical column address being located within a second region of the data buffer, wherein data from the host can be written into the second region by the controller circuit when the ECC circuit is in the valid state, and when the ECC circuit is in the invalid state, receiving a third logical column address and a second write data from the host, and writing the second write data to a third physical column address of the data buffer and writing the error correction code generated by the host from the second write data to a fourth physical column address of the data buffer, the third physical column address being located within the second region of the data buffer and the fourth physical column address being located within the first region of the data buffer.

16. The method according to claim 15, wherein operational settings of the ECC circuit are stored in the memory device and one of the operational settings is an ECC setting to set the ECC circuit to the valid state or the invalid state.

17. The method according to claim 16, further comprising:
setting the ECC setting through a command received from the host through the serial interface.

18. The method according to claim 15, wherein the serial interface conforms to Serial Peripheral Interface (SPI).

19. The method according to claim 15, wherein an addressable column address range of a page of memory cells to be written is varied according to whether the ECC circuit is set to the valid state or the invalid state.

20. The method according to claim 15, wherein the third physical column address is within a non-user programmable region dedicated to storage of ECC parity bits generated by the ECC circuit when the ECC circuit is in the valid state, and
wherein, when the ECC circuit is in the invalid state and the ECC circuit detects an error in the second write data, the ECC circuit does not perform error correction on the second write data and sets an error correction signal to a predetermined state to indicate to the host that the second write data has an error that has not been corrected by the ECC circuit.

* * * * *